United States Patent [19]
Georgi

[11] 3,942,123
[45] Mar. 2, 1976

[54] ELECTRONIC MEASUREMENT SYSTEM

[75] Inventor: Heinz W. Georgi, La Jolla, Calif.

[73] Assignee: IVAC Corporation, San Diego, Calif.

[22] Filed: July 3, 1974

[21] Appl. No.: 485,539

Related U.S. Application Data

[60] Division of Ser. No. 287,341, Sept. 8, 1972, Pat. No. 3,877,307, which is a continuation-in-part of Ser. No. 45,990, June 15, 1970, Pat. No. 3,702,076.

[52] U.S. Cl................ 328/1; 73/362 AR; 324/79 D; 324/99 R; 324/DIG. 1; 328/3; 328/48
[51] Int. Cl.².......................................... G01K 7/24
[58] Field of Search........................... 328/1–6, 41, 328/48; 307/257; 324/71 CP, 79 D, 83 D, 98–101, DIG. 1; 73/362 AR

[56] References Cited
UNITED STATES PATENTS

| | | | |
|---|---|---|---|
| 3,044,065 | 7/1962 | Barney et al...................... | 328/41 X |
| 3,364,469 | 1/1968 | Long.................................. | 328/41 X |
| 3,688,201 | 8/1972 | Pommerening................... | 324/83 D X |

*Primary Examiner*—Siegfried H. Grimm
*Attorney, Agent, or Firm*—Fulwider, Patton, Rieber, Lee & Utecht

[57] ABSTRACT

An electronic method and apparatus for measuring temperatures by means of a thermistor in one arm of an electrical bridge, bridge output being varied by the on and off duty cycle of a shunting impedance selectively switched into and out of the balancing arm of the bridge in accordance with the relative states of a counting display register and a cyclically scanned counting register, the display register state being altered by gated pulses, under the control of bridge output, to provide a digital indication of measured temperature. Bridges of both the nulling and non-nulling types are disclosed using either a dual ramp integrator or conventional detector acting upon bridge output to provide an impedance measurement subsystem independent of reference supply voltage and also enabling non-linear analog to digital conversion to compensate for a non-linear thermistor temperature vs. thermistor resistance characteristics, without sacrificing measurement sensitivity. Anticipation circuitry is provided for monitoring and correlating the display register pulses with the time vs. temperature response characteristic of the thermistor, to selectively alter bridge balance and display register state so as to provide an advance indication of the anticipated temperature at which the termistor will finally stabilize.

3 Claims, 17 Drawing Figures

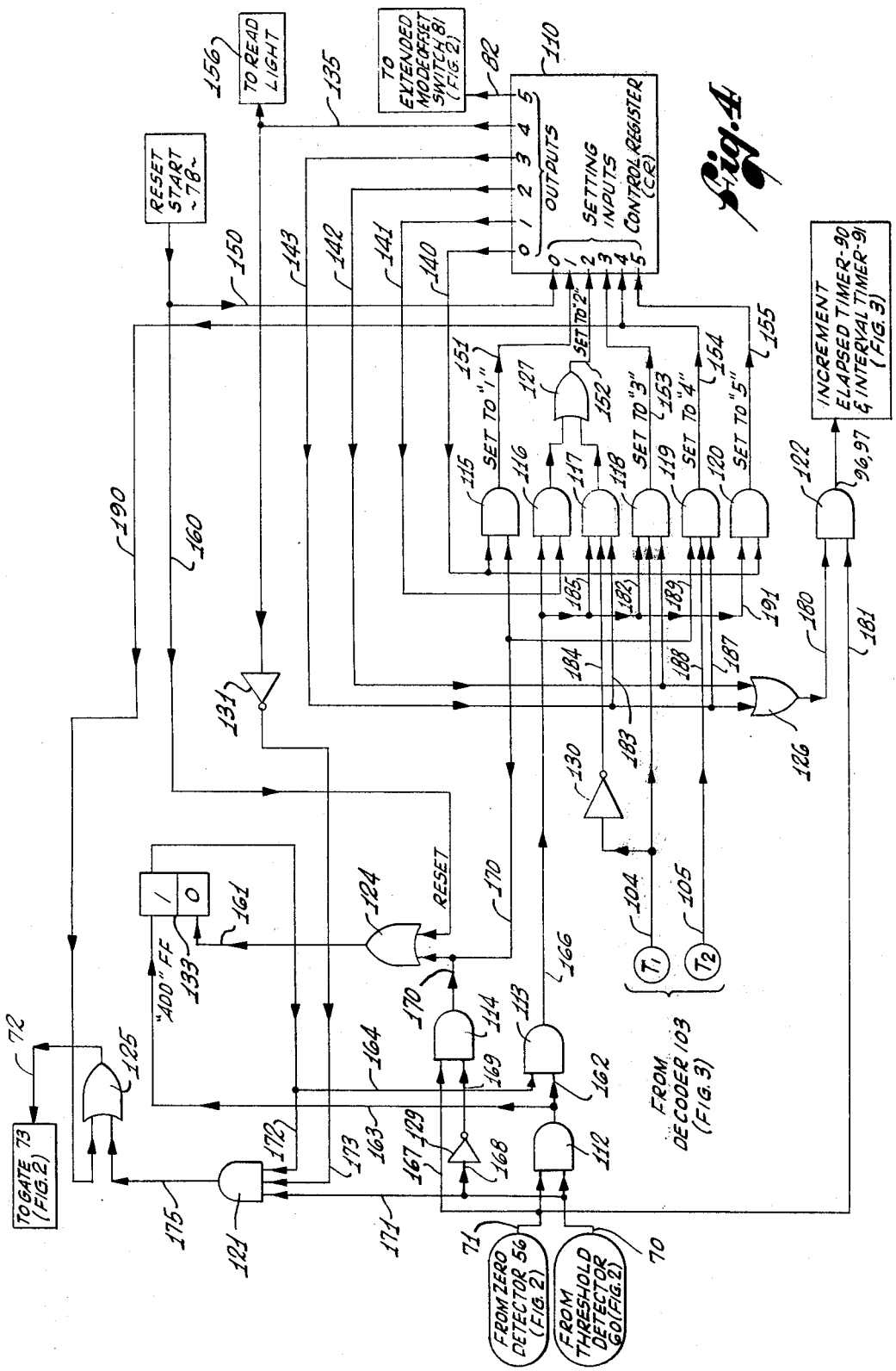

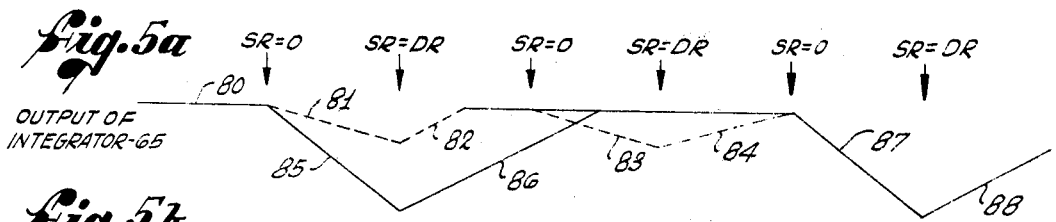
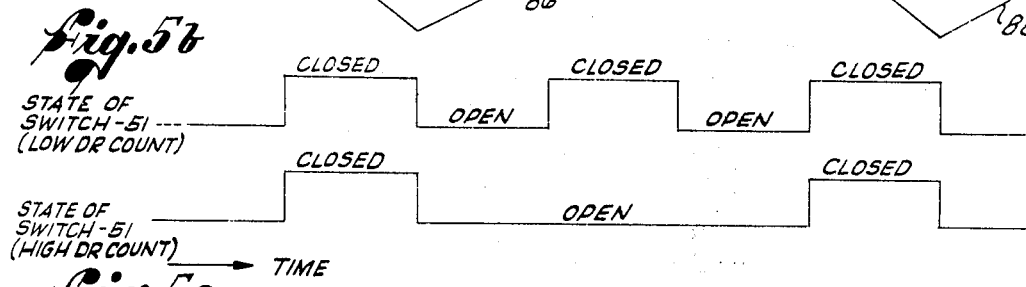
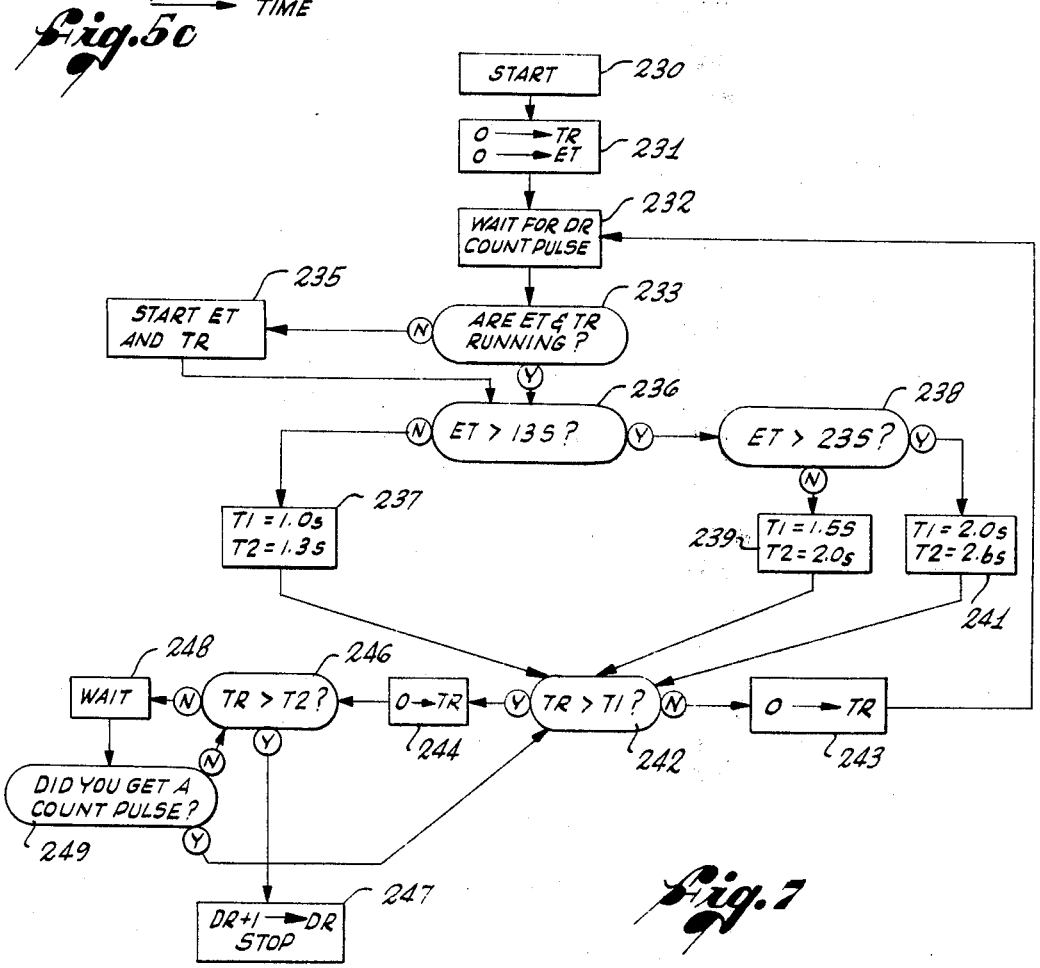

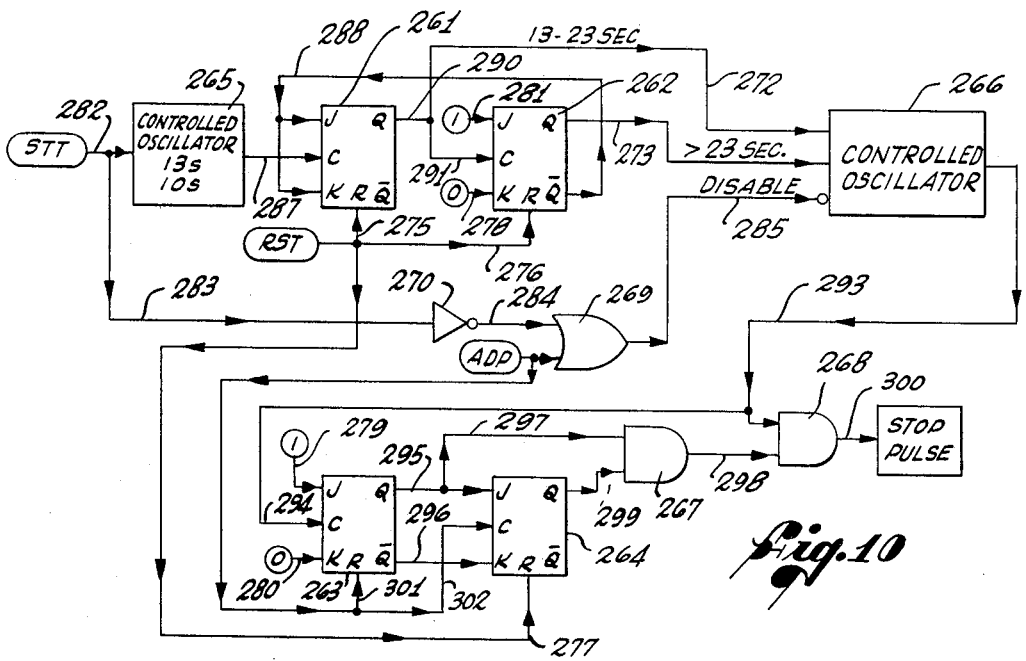
*Fig.10*
*Fig.11a*
*Fig.11b*
*Fig.11c*
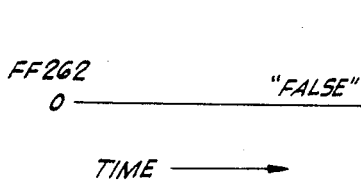
*Fig.11d*

ELECTRONIC MEASUREMENT SYSTEM

CROSS-REFERENCE TO RELATED APPLICATIONS

This application is a division of application Ser. No. 287,341, filed Sept. 8, 1972, now U.S. Pat. No. 3,877,307, which is a continuation-in-part of application Ser. No. 45,990, filed June 15, 1970 and now U.S. Pat. No. 3,702,076. Both of the parent applications, Ser. Nos. 287,341 and 45,990 are assigned to the same assignee as the present application, and all of the disclosure in the parent applications are specifically incorporated by reference in this application.

BACKGROUND OF THE INVENTION

This invention relates generally to improvements in measurement methods and apparatus and, more particularly, to a new and improved electronic thermometer system enabling very rapid, accurate, reliable and easily read temperature measurements.

It is common practice in the medical arts, as in hospitals and in doctors' offices, to measure the body temperature of a patient by means of a glass bulb thermometer incorporating a heat responsive mercury column which expands and contracts a calibrated temperature scale. Typically, the glass thermometer is inserted into the patient, either orally or rectally, and subsequently removed after a sufficient time interval has passed to enable the temperature of the thermometer to stabilize at the body temperature of the patient. This time interval is usually of the order of two to four minutes. After a sufficient period of time has passed, the thermometer is removed from the patient and is subsequently read by appropriate medical personnel.

It will be apparent from the foregoing that conventional temperature measurement procedures using glass bulb thermometers and the like are prone to a number of significant deficiencies. Temperature measurement is rather slow and, for patients who cannot be relied upon (by virtue of age or infirmity) to properly retain the thermometer for the necessary period of insertion in the body, may necessitate the physical presence of medical personnel during a relatively long measurement cycle, thus wasting valuable time. Furthermore, glass bulb thermometers are not as quick and easy to read and, hence, measurements are prone to human error, particularly when made under poor lighting conditions or read by harried personnel.

Various attempts have been made by the prior art to minimize or eliminate the aforedescribed deficiencies of the glass bulb thermometer by using appropriate temperature sensing probes which are designed to operate in conjunction with direct reading electrical thermometer instrumentation, typically employing an output galvanometer having an indicator needle moving along a calibrated scale. However, such probes and electrical thermometers have typically proven to be just as slow in making temperature measurements as glass bulb thermometers and, at best, output measurements have been only slightly easier to read.

Hence, those concerned with the development and use of thermometer apparatus in the medical field as well as measurement systems generally, have long recognized the need for improved temperature measuring devices which result in accurate, reliable, more rapidly obtained and easily read measurements. An electronic thermometer satisfying all of these requirements is disclosed in the aforementioned co-pending application Ser. No. 45,990. This electronic thermometer provides a temperature measurement output as a direct digital display and further employs a novel anticipation technique to provide an advance indication of the temperature at which a thermistor probe will finally stabilize. The anticipation technique used causes the state of the digital measuring means to be altered during a measurement cycle by a single value representing a fixed temperature differential, the magnitude of the correction value and the duration of the temperature measurement cycle being correlated as a function of the rate of change of the temperature being measured.

Basically, the electronic thermometer described in parent application Ser. No. 45,990 includes a temperature-responsive transducer in one arm of an electrical bridge network, the bridge including a balancing arm having a variable impedance, the impedance being selectively varied under the control of a digital counter indicating temperature, the counter being continually counted up by electrical impulses so long as the transducer temperature exceeds the temperature represented by the bridge balance impedance. The time period between successive impulses to the counter, i.e., the pulse period or pulse rate, is correlated with the time vs. temperature characteristic of the temperature responsive transducer to selectively alter bridge balance, and, hence, the state of the counter, so that the counter will rapidly count up to the anticipated temperature at which the transducer will finally stabilize. The latter is accomplished substantially sooner than actual stabilization of the transducer at its final temperature. The final temperature registered in the counter is appropriately indicated by a digital display unit connected to receive the counter output, the digital display providing an easily read output indication of temperature.

An electronic thermometer embodying the various features of the invention set forth in patent application Ser. No. 45,990 may include a thermistor as a temperature responsive transducer in the measurement arm of a Wheatstone bridge, the balancing arm of the bridge having a bank of parallel resistances, each resistance being selectively inserted into the bridge balancing arm under the control of its own switch, all of these switches being in turn controlled by various counting states registered in the digital counter indicating temperature, the counter being counted up by clock pulses which are gated on only when the thermistor temperature exceeds the equivalent temperature represented by the resistance in the bridge balancing arm. Since the thermistor approaches its final stable temperature asymptotically, the last increments of temperature change occur very slowly, whereas the major portion of the temperature change, in stabilizing the thermistor at the temperature of the environment, occurs relatively rapidly. In this regard, the time period between clock pulses gated to the counter is correlated with the rate of change of the thermistor temperature to anticipate the remaining temperature differential between the actual thermistor temperature and the final thermistor temperature, and to alter the balancing arm of the bridge accordingly so that the counter registers the anticipated final temperature long before the thermistor would normally actually stabilize at such a final temperature. This results in a much more rapid, yet accurate and reliable temperature measurement.

Correlation of the time period between clock pulses, or pulse rate, passing through the counter, with the temperature vs. time characteristic of the thermistor, and altering the state of balance of the bridge, may be accomplished in any of several ways. In one embodiment of the electronic thermometer set forth in application Ser. No. 45,990, an additional resistance shunts the bridge balancing arm so that the balancing arm and the counter are offset by the equivalent of a predetermined temperature differential, i.e., the counter is driven to a higher counter state than would ordinarily be dictated by the actual thermistor temperature, in order to compensate for the additional resistance shunting the balancing arm. Hence, the temperature indicated by the counter display leads the actual temperature of the thermistor by the predetermined temperature differential. It is readily ascertained empirically, for any given thermistor probe, how the rate of change of temperature varies with time, and the latter is correlated with the time period between pulses passed to the counter to determine when the actual thermistor temperature differs from its final stable temperature by the aforedescribed predetermined temperature differential between the counter state and the temperature represented by the bridge balancing arm resistance. In this connection, the pulse period for pulses incrementing the counter is monitored and, when the pulse period reaches the proper magnitude, the pulses to the counter are gated off to freeze the counter and its associated display at an indication representing the anticipated final temperature of the thermistor.

In another embodiment described in application Ser. No. 45,990, a specified time of measurement is selected, e.g., 15 seconds. At that point, voltage which is a function of the remaining temperature differential between the actual thermistor temperature and its ancitipated final temperature is inserted into the bridge balancing arm to deliberately unbalance the bridge and to force the counter to rapidly count up to the state representing the final anticipated temperature.

The temperature anticipation method described in connection with the aforementioned electronic thermometer system applies a fixed correction to the temperature measured by the thermistor probe, under the assumption that the heating of the probe occurs with essentially the same temperature vs. time characteristic each and every time a temperature is taken. However, variations in personnel measurement techniques, probe time constants, and even the variations in thermal response characteristic of biological tissue from one patient to another may cause variations in the final temperature vs. time function which affect the accuracy of the temperature readings obtained. In this regard, the use of a fixed correction is intended for an idealized case where substantially optimum technique is employed in taking temperatures.

For example, the optimum measurement technique may call for insertion of the thermistor probe into the patient's mouth and maintaining the probe tip in constant contact with the tissue under the tongue while sliding the probe tip along the tongue for five or six seconds to that the probe tip is continually exposed to fresh tissue during this time interval. Otherwise, a "draw down" phenomenon may occur wherein the probe tip cools down the tissue excessively so that the time constant for arriving at the final temperature measurement is different from the expected time constant for the idealized case. In addition, since counter pulse rate is monitored to either vary the magnitude of the correction or determine when the measurement cycle should be terminated, it will be apparent that loss of probe contact with the tissue early in the temperature measurement cycle may result in an unduly long pulse period, which causes the anticipation circuitry to believe it has reached the searched for portion of the time vs. temperature characteristic and, therefore, prematurely terminate the measurement cycle. In this case, a low temperature reading would result.

The aforedescribed requisites for optimum technique cannot reliably be obtained by untrained personnel, with a consequent requirement for relatively time-consuming and costly training effort necessary to insure proper usge by appropriate medical personnel.

Accordingly, those concerned with the development and use of temperature measurement methods and apparatus have recognized the desirability for further improvement in temperature measurement systems enabling enhanced accuracy, with even greater reliability, and with less dependence upon the use of optimum technique by personnel making such measurements. In addition, there has been a desire for improved electronic means for implementing such temperature measurement systems, characterized by greater accuracy, reliability, economy, simplicity, enhanced linearity of response, stability and suitability for implementation by modern electronic manufacturing methods, such as MOS (metal oxide semiconductor) technology. The present invention fulfills all of these needs.

SUMMARY OF THE INVENTION

Briefly, and in general terms, the present invention provides a new and improved measurement system and electronic thermometer enabling a temperature measurement output as a direct digital display and, further, capable of providing, substantially independent of operating personnel technique, an accurate and reliable final temperature measurement output indication prior to actual stabilization of the thermometer input at the anticipated final temperature indicated. In addition, the present invention provides improvements in maximum reading analog-to-digital converters, utilizing either nulling or non-nulling bridges, and further provides means for compensating for non-linear thermistor response to provide an output which is a linear function of temperature even though the resistance of the thermistor is a non-linear function of temperature.

Basically, the present invention includes an improved electronic method and apparatus for measuring temperatures by means of a temperature responsive transducer in an electronic network having an output which controls the state of a digital counter indicating temperature, the counter being continually counted up by electrical impulses so long as the transducer temperature exceeds the temperature represented by a prescribed state of the transducer network, the latter state being under the control of the counter so that the temperature indicated by the counter leads the transducer temperature by a predetermined temperature differential. The rate at which the temperature being measured is changing is directly related to the pulse period or time between successive impulses to the counter and is correlated with the time vs. temperature characteristic of the temperature responsive transducer to control the state of the counter so that the counter will rapidly count up to provide an advance indication of the anticipated temperature at which the transducer will finally stabilize. The final temperature registered on the counter is appropriately indicated by a digital display unit connected to receive the counter output, the digital display providing an easily read output indication of temperature.

In accordance with the invention, a variable correction subsystem and a pulse period sequence safeguard subsystem are utilized to make temperature measurements less dependent on operator measurement techniques, even by untrained personnel. In this connection, the pulses driving the display counter are monitored, and the particular pulse rate searched for is selectively altered during a measurement cycle as a function of the elapsed monitoring period for the measurement cycle. Alternatively, if the pulse rate searched for is held constant, then the magnitude of the correction increment added to the display counter by the anticipation network is a function not only of rate of change of temperature but also of elapsed monitoring period for the measurement cycle.

In addition, in order to compensate for possible loss of tissue contact during a measurement cycle, the temperature measurement system will not certify the final output indication unless the indication is made after certain pulse sequence conditions have been met. In this regard, a plurality of successively increasing pulse periods, in excess of a prescribed pulse interval, are required before the measurement cycle is terminated. This prevents any error due to loss of tissue contact where the period of loss contact exceeds the termination pulse period interval searched for and would thus cause a corresponding false termination of the measurement cycle. Hence, the safeguard network is a resetting subsystem requiring a prescribed sequence of pulse periods for proper completion of the measurement cycle and thereby minimizes false readings which might otherwise be provided by poor measurement technique of operating personnel.

By way of example, the safeguard subsystem, in accordance with the invention, searches for two time periods in sequence, a first pulse period somewhat shorter than the pulse period normally indicating termination of the measurement cycle, followed by a second pulse period at least equal to the termination determining pulse period duration. The search for the second pulse period does not begin until the first pulse period has occurred, i.e., occurrence of the first prescribed pulse period is a condition precedent to the search for the second pulse period. If a pulse period shorter than the first pulse period occurs after the first pulse period has been detected, the safeguard sybsystem is reset and again searches for the first pulse period rather than the second pulse period, thereby again requiring a double pulse period sequence of prescribed magnitudes as though the first pulse period had never been detected at all during the measurement cycle.

In addition, since the magnitude of the anticipation correction is a function not only of rate of change of measured temperature, but also of elapsed time from a prescribed reference point in a given measurement cycle, the magnitude of the particular pulse periods searched for is increased with increasing elapsed time. For example, the initial pair of pulse periods searched for might be 1.0 seconds followed by 1.3 seconds. If it takes longer than 13 seconds, but less than 23 seconds to complete the measurement cycle, the pulse period sequence searched for is increased to 1.5 seconds and 2.0 seconds, respectively, If it takes longer than 23 seconds to make a temperature measurement then the pulse period sequence searched for by the safeguard subsystem is 2.0 seconds and 2.6 seconds.

The first and second pulse periods are selected sufficiently close to each other in magnitude so that measurement errors are minimal in the event of the very remote possibility that tissue contact is lost at a point in time immediately after the first pulse period requirement has been met.

The present invention also includes a bridge network for linearlizing the response characteristics of the temperature responsive transducer, without reducing sensitivity, by proper selection of the magnitudes and ratio of magnitudes of the bridge impedances, in a non-linear, maximum reading analog-to-digital conversion system. Moreover, the transducer input network, including the bridge and bridge detector, essentially provides an impedance measurement subsystem independent of reference supply voltage. The bridge may be of the nulling or non-nulling types, using either a dual ramp integrator or conventional detector, depending upon the speed of response desired in correlating transducer input changes with indicated output.

More specifically, and in a presently preferred embodiment, by way of example and not necessarily by way of limitation, an electronic thermometer embodying the various features of the invention may include a thermistor as the temperature responsive transducer in the measurement arm of a bridge network of essentially the Wheatstone type, the balancing arm of the bridge including a shunt resistance selectively switched into and out of the bridge so that the bridge output is varied by the on and off duty cycle of the latter resistance, the resistance being switched into and out of the balancing arm of the bridge in accordance with the relative states of a constantly compared counting display register and a cyclically scanned counting register, the display register being counted up by pulses which are gated on only when the thermistor temperature exceeds the equivalent temperature represented by the average resistance in the bridge balancing arm, the latter resistance average being varied by the on and off duty cycle of the balance arm shunt resistance.

Since the thermistor approaches its final stable temperature asymptotically, it will be apparent that the last increments of temperature change occur very slowly, whereas the major portion of the temperature change in stabilizing the thermistor at the temperature of the environment, occurs relatively rapidly. Hence, the time period between the pulses gated to the display register is correlated with the rate of change of the thermistor temperature to anticipate the remaining temperature differential between the actual thermistor temperature and the final thermistor temperature, and to alter the balancing arm of the bridge network accordingly so that the display register indicates the anticipated final temperature long before the thermistor would normally actually stabilize at its final temperature.

This alteration of bridge balance is accomplished by additional anticipation correction resistance included in the bridge balance arm so that the balancing arm and the display register are normally out of phase by the equivalent of a predetermined temperature differential, i.e., the display register is driven to a higher counter state than would ordinarily be dictated by the actual thermistor temperature, in order to compensate for the additional resistance of the balancing arm. Hence, the temperature indicated by the display register leads the actual temperature of the thermistor by the predetermined temperature differential or anticipation correction.

The time intervals between pulses passed to the display register are monitored and, when the time intervals reach the proper magnitudes, further pulses to the display register are gated off to freeze the register and its associated display at an indication representing the anticipated final temperatue of the thermistor.

Alternatively, the relationship between the compared states of the display register and the scanning register can be altered, thereby altering the on and off duty cycle of the shunting resistance and the balancing arm of the bridge, to provide the desired anticipation correction.

If desired, an ordinary null detector may be used with the bridge so that out of null conditions in a prescribed direction can be sensed and used to control the gating of pulses which drive the display register. In a presently preferred embodiment, a non-nulling bridge is utilized with bridge output directed to a dual ramp integrator which evaluates the differences between the thermistor temperature and the count in the display register on a cycle basis, each cycle referring to a complete counter scanning cycle of the continuously running scanning register. This arrangement also provides electrical output essentially independent of the reference voltage supply.

The states of the display register and the cyclical scanning register are constantly compared, and the on and off duty cycle of the shunting resistance in the balancing arm of the bridge network is varied in accordance with the relative states of the two registers. For example, the latter resistance is switched into the bridge between the time that the scanning register is at some selected reference state, such as zero, and the time that the scanning register is equal to the display register. When the count in the scanning register exceeds the count in the display register, the shunt resistance is switched out of the bridge network until the scanning register again arrives at the prescribed zero or other reference state.

An interval timer, which is reset by each pulse driving the display register, measures the intervals between pulses and, through appropriate decoding, indicates when the pulse periods required by the safeguard subsystem have been achieved, so that an appropriate control subsystem can appraise the pulse sequence and determine whether or not the measurement cycle should be terminated.

An elapsed timer, incremented every time the scanning register completes a scanning cycle, keeps track of the elapsed monitoring period from a prescribed reference point in a given measurement cycle. For example, the initial reset state of the thermometer system may be an output indication of 94°F, and, hence, the reference point at which the elapsed timer would begin to keep track of the monitoring period in any given measurement cycle would be the first display register counting pulse indicating a temperature in excess of 94°F, e.g., 94.1°F. The state of the elapsed timer is decoded and either modifies the counter modulus of the interval timer or alters the decoding for the interval timer so that, when the elapsed timer reaches certain prescribed states, such as 13 seconds and 23 seconds, the pulse period sequences provided by the output of the interval timer decoding to the control subsystem are correspondingly altered. In this way, the anticipation correction is a function not only of rate of change but also of elapsed time. Of course, rather than changing the magnitudes of the pulse period sequences, the magnitudes of the anticipation correction resistance in the bridge network can be altered instead, to provide the compensating correction for elapsed time.

In accordance with the invention, means are also taught for adapting digital electronic thermometers, such as that set forth in copending patent application Ser. No. 45,990, so that they may embody the advantageous features of the pulse sequence safeguard subsystem and the variable anticipation correction as a function of elapsed time.

Hence, the electronic method and apparatus of the present invention supplements the improvements of the measurement systems set forth in copending patent application Ser. No. 45,990, in satisfying a long existing need in the medical arts for a measurement system and thermometer capable of making accurate, reliable and easily read temperature measurements much more rapidly than has heretofore been feasible with the thermometers of the prior art and, further, in a manner which is essentially independent of the measurement techniques employed by various operating personnel.

The above and other objects and advantages of this invention will be apparent from the following more detailed description when taken on conjunction with the accompanying drawings of illustrative embodiments.

DESCRIPTION OF THE DRAWINGS

FIG. 4 is a block diagram of a control subsystem suitable for use with the system of FIGS. 2 and 3;

FIGS. 5a, 5b and 5c are wave forms applicable to various portions of the electrical circuitry illustrated in FIG. 2, FIG. 5a being directed to electrical output ramps of the dual ramp integrator, while FIGS. 5b and 5c show the state of a switch controlling the duty cycle of a resistance shunting the balancing arm of a bridge under various ramp output conditions;

FIG. 7 is a flow chart illustrating an algorithm for varying the magnitudes of the pulse intervals in the pulse period sequence of the safeguard subsystem;

FIG. 8 is a combined block diagram and electrical schematic of a portion of the electronic thermometer set forth in FIG. 2, but modified to introduce anticipation correction increments of different magnitudes, rather than variations in the magnitude of the pulse intervals searched for;

FIG. 10 is a block diagram of an adapter subsystem for modifying digital thermometers to incorporate the pulse period sequence safeguard feature and variable correction with elapsed monitoring period feature of the present invention;

FIGS. 11a through 11d are wave forms applicable to various portions of the electrical subsystem illustrated in FIG. 10.

DESCRIPTION OF THE PREFERRED EMBODIMENT

Figure 1:
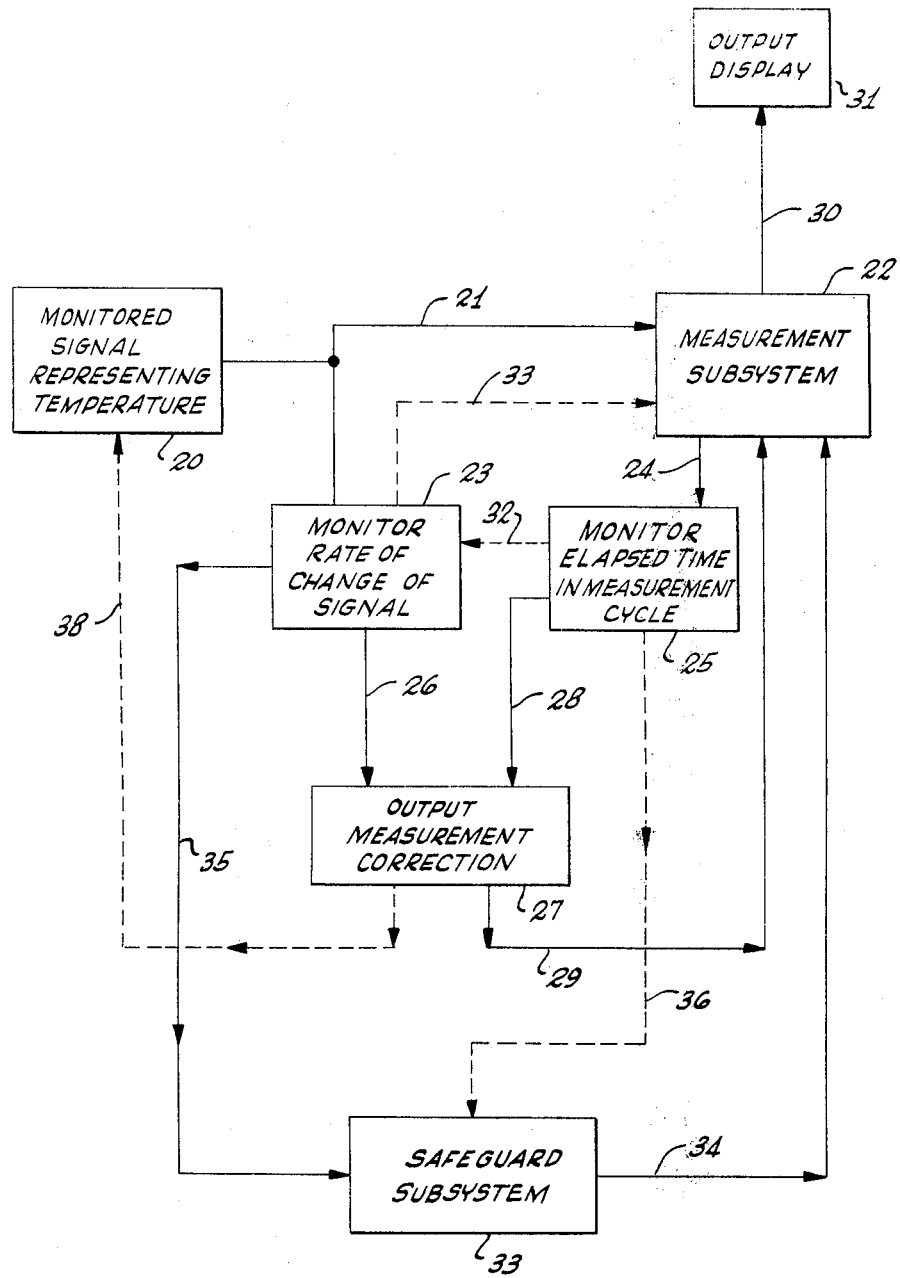
FIG. 1 is a block diagram of an overall system in which some of the basic concepts of the temperature measurement method and apparatus of the present invention are embodied.

Referring now to FIG. 1 of the drawings, there is shown a new and improved system for temperature measurement embodying features of the present invention.

An appropriate signal source 20 provides a signal, representing the temperature being monitored, over line 21 to a suitable measurement subsystem 22 and simultaneously directs the signal to a subsystem 23 for monitoring the rate of change of the signal. The source of the signal may be a thermistor or other temperature responsive transducer and may include appropriate networks for shaping the response characteristic and converting the signal fron analog to digital form. While the signal may remain in analog form for the practice of some features of the invention, the presently preferred embodiments of the invention contemplate use of signals in primarily digital form.

The measurement subsystem 22 may include a counter, a plurality of counters operating in concert, or any other measurement network capable of suitably responding to the monitored signal representing temperature.

The measurement subsystem 22 provides an output over line 24 indicating a starting reference point for the monitoring period in the temperature measurement cycle. By way of example, in preferred embodiments of the invention, this temperature is selected as 94°F and, accordingly, output is provided over line 24 only when the signal over line 21 to the measurement subsystem 22 indicates that the temperature has exceeded the referenced 94°F. The latter event activates a subsystem 25 for monitoring elapsed time in the measurement cycle.

The figure of 94°F as a starting reference point in a measurement cycle is not critical, but is used by way of practical example in the ensuing discussion. It will be apparent that other initial temperature settings may be selected, and that the temperature may be expressed in any convenient scale of temperature units, such as degrees Centigrade instead of degrees Fahrenheit.

The rate of change monitoring subsystem 23 provides a conditioning output over line 26 to an output measurement correction subsystem 27 which is also responsive to the state of the elapsed time monitoring subsystem 25, as indicated schematically by the line 28, to provide an anticipation correction increment over line 29 to the measurement subsystem 22 so that the measurement subsystem will provide an advance indication of the anticipated temperature at which the temperature responsive transducer will finally stabilize. The output of the measurement subsystem 22 is appropriately directed over line 30 to any suitable output display subsystem 31, preferably in an easily read digital format. Hence, the output measurement correction subsystem 27 is conditioned as a function of the rate of change of the monitored signal and also as a function of elapsed time from the occurrence of a starting reference level in any given measurement cycle.

Instead of effecting the output measurement correction subsystem 27 directly, the elapsed time measurement subsystem 25 may act upon the rate of change monitoring subsystem 23, as indicated by the dashed line 32, so that the particular rate of change searched for is altered as a function of elapsed time, and the latter rate of change is, in turn, used to condition the time of insertion of the output measurement correction into the measurement subsystem 22 or alternatively, if the correction is already inserted into the measurement subsystem 22, the time when the measurement cycle is terminated. In this latter regard, the rate of change monitoring subsystem may direct an input over dashed line 33 to the measurement subsystem 22.

While the output measurement correction subsystem 27 is shown in FIG. 1 as directing an input over line 29 to the measurement subsystem 22, it will be appreciated that the correction subsystem can, instead, direct its output to the signal source subsystem 20, and this alternative approach is indicated schematically by the dashed line 38 in FIG. 1. The only difference between the two approaches shown is the point of insertion of the anticipation correction in the overall system.

A safeguard subsystem 37 conditions the measurement subsystem 22 over line 34 and prevents false termination of the measurement cycle which might otherwise occur in the event of a detection of a rate of change calling for termination and induced not by the normal temperature vs. time characteristic of the temperature transducer but instead by a measurement cycle interruption. Such an interruption might occur, for example, if a thermometer probe loses contact with the tissue of the patient whose temperature is being taken. When contact is re-established with the tissue, the measurement cycle will normally resume, unless the hiatus in the measurement cycle is sufficient to cause the rate of change subsystem 23 and measurement subsystem 22 to believe that the proper termination point in the measurement cycle has been reached. If this occurred, the output display 31 would indicate a final output represented by an erroneously low temperature reading. In order to prevent this type of error, the safeguard subsystem receives an input over line 35 from the rate of change subsystem 23 and prevents termination of the measurement cycle by the measurement subsystem 22 until certain prescribed conditions regarding successive signal rate of change samplings have first been met. In digital form, the technique employed by the safeguard subsystem 37 requires a predetermined pulse perios sequence to occur before enabling the measurement subsystem 22 to terminate the measurement cycle.

In a presently preferred embodiment, the safeguard subsystem 37 requires a pair of sequential pulse periods (or pulse rates) detected by the rate of change subsystem 23, wherein the second pulse period is of a magnitude which would normally call for termination of the measurement cycle, and the first pulse period is of a magnitude somewhat shorter than the termination pulse period. For example, if the termination pulse period is 1.3 seconds, the requirement for the first pulse period might be an interval of 1.0 seconds or more. A time interval between signal pulses equal to or greater than the first pulse period searched for is required before any search for the second pulse period is even initiated. If a pulse interval shorter than the required first pulse period occurs after the first pulse period requirement has been met, as would occur in the case of loss of tissue contact for some time followed by reacquisition of tissue contact, the safeguard subsystem 37 will be reset and again require a double pulse period sequence, as though the first pulse period requirement had never been met during the measurement cycle.

The first and second pulse periods are selected sufficiently close to each other in magnitude so that measurement errors are minimal in the event of the very remote possibility that tissue contact is lost at a point in time immediately after the first pulse period requirement has been met.

Since the pulse period sequence required by the safeguard subsystem 37 will vary as a function of elapsed time in those instances where the output measurement correction is a single fixed increment, an input is shown to the safeguard subsystem 37 over dashed line 36 from the elapsed time measurement subsystem 25.

Hence, it will be apparent that the temperature measurement method and apparatus schematically depicted by the overall system embodiment of FIG. 1 provides an advance indication of final temperature by introducing an output measurement correction whose magnitude, or time of introduction, or whose magnitude coupled with the selected time of termination of the measurement cycle, is a function both of the rate of change of the parameter being monitored and the elapsed time from a prescribed reference point in the measurement cycle. The desired anticipatory output indication may be provided by varying the actual magnitude of the correction introduced, or altering the particular signal rate of change searched for in determining when the measurement cycle should be terminated, or a combination of both expedients may be employed if desired. In addition, premature false termination is avoided by the requirement of a required rate of change sequence before detected rate of change calling for termination will be recognized as such.

While the various monitoring, measurement, correction and safeguard subsystems are shown as separate entities in FIG. 1, for purposes of illustrating their functional inter-relationship in acting upon measurement data, the various subsystems may be combined wherever feasible or desired for purposes of specific system implementation.

Figure 2:
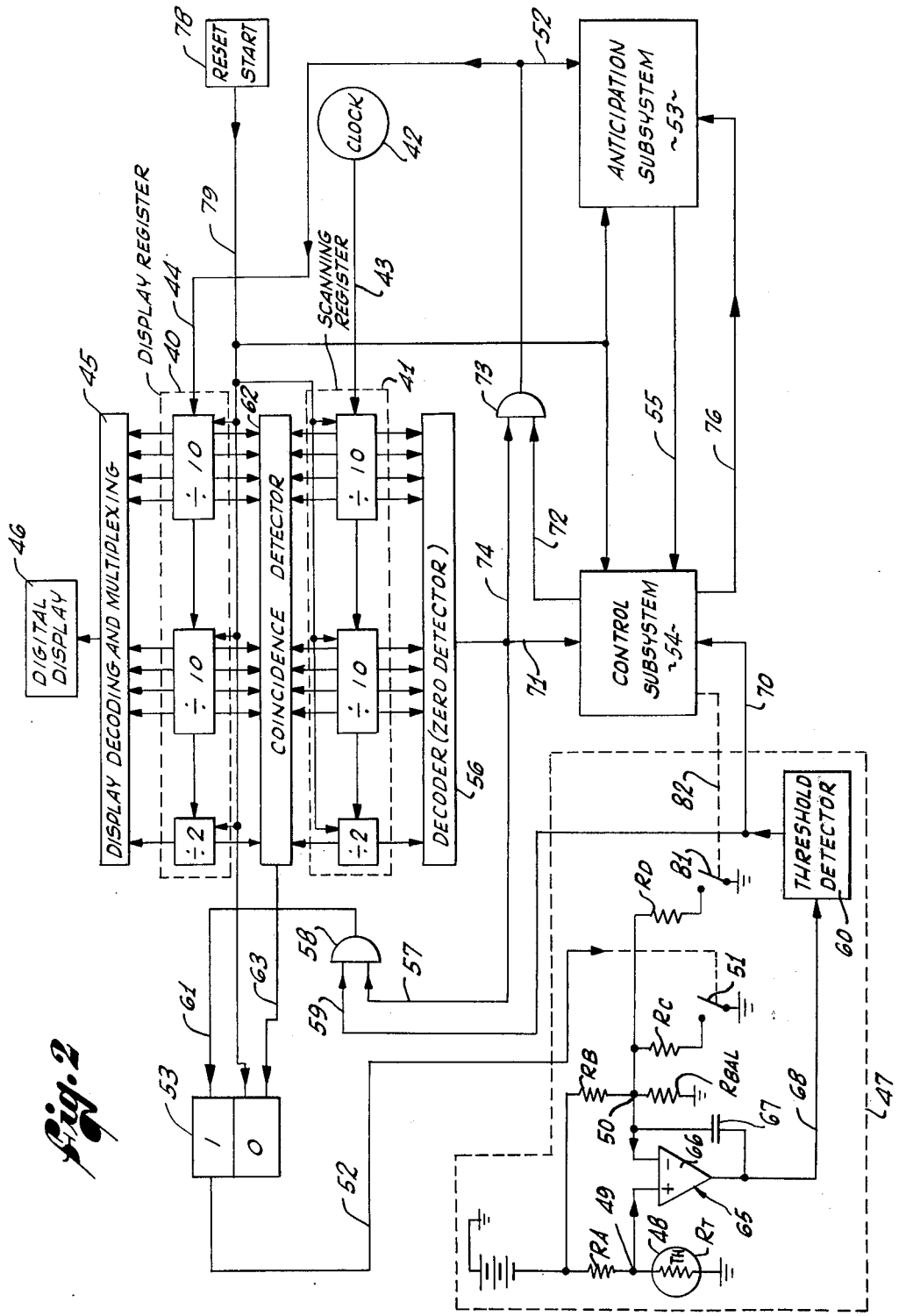
FIG. 2 is a combined block diagram and electrical schematic of one embodiment of an electronic thermometer in accordance with the present invention, with particular emphasis upon the analog to digital conversion system.
Figure 3:
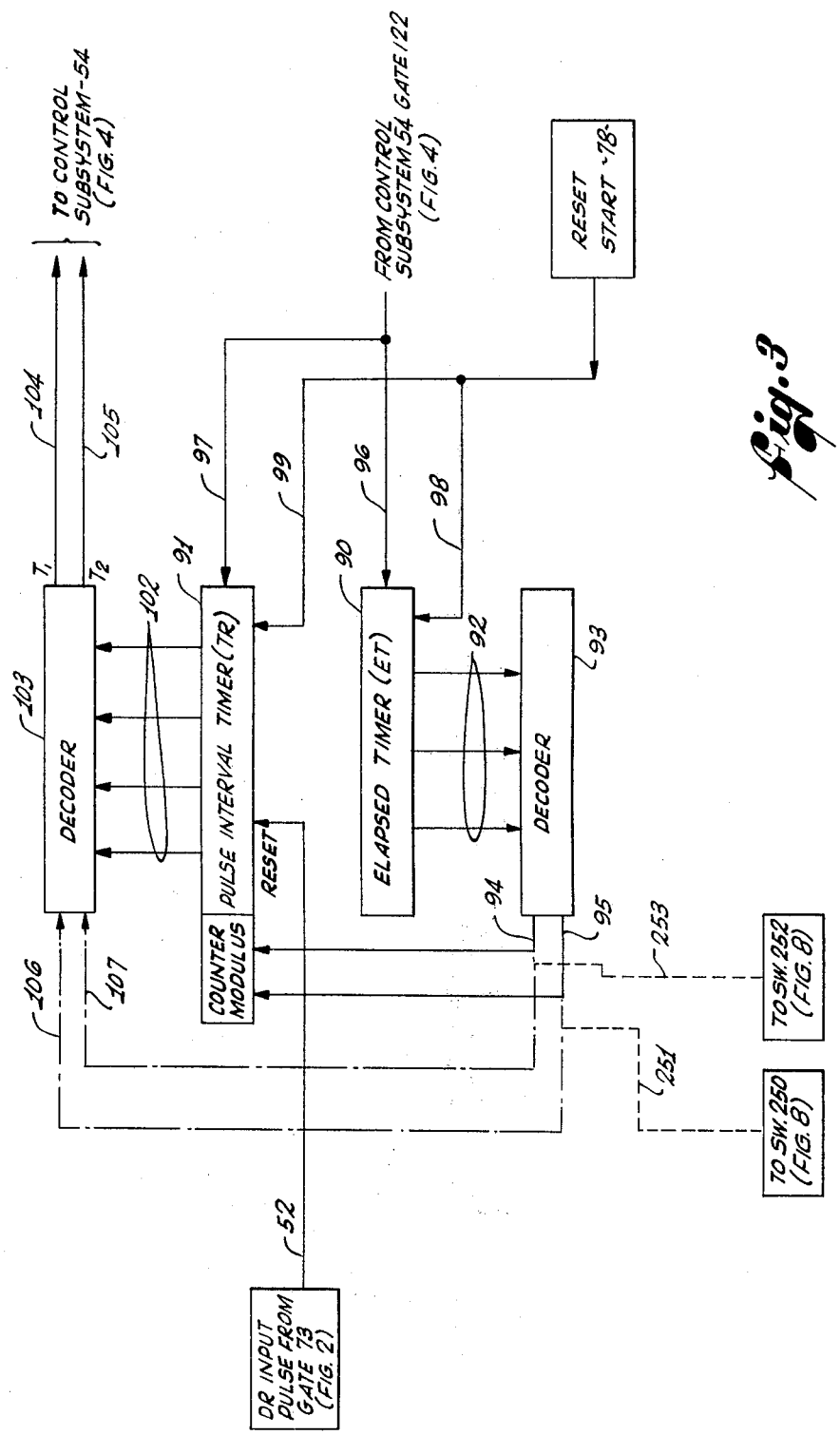
FIG. 3 is a block diagram of the anticipation subsystem, with emphasis on the pulse interval timing and elapsed monitoring period timing, suitable for use with the system of FIG. 2.

By way of clarification with regard to the various digital electronic systems described herein, all of the apparatus systems disclosed in FIGS. 2 through 4, for purposes of setting forth illustrative embodiments, are synchronous systems operating on a conventional clock system with clock inputs to all of the flip-flops, registers and counters, with all gates being set on the previous clock pulse, while flip-flops are normally set on the next clock pulse. For purposes of simplicity, the conventional clock inputs have been omitted from the drawings. It will also be appreciated that, while conventional synchronous logic is employed in the illustrated embodiments, those of ordinary skill in the art can readily provide equivalent logic in asynchronous form without departing from the invention.

Referring now to FIG. 2 of the drawings, there is shown a generalized system for one embodiment of an electronic thermometer incorporating the novel features of the present invention. The thermometer of FIG. 2 includes a basic anticipatory measurement system incorporating an improved maximum reading analog to digital converter and bridge network, including a dual ramp integrator as the bridge network detector, for a rapid cycle by cycle analysis of the indicated output temperature of the thermometer relative to the temperature being measured.

The thermometer system shown in FIG. 2 is also capable of being operated in either an extended mode, wherein the indicated temperature is the same as the temperature of the thermistor, or in a rapid anticipation mode wherein the measured temperature indicated is an extrapolated higher termperature rather than the actual thermistor temperature.

The system of FIG. 2 includes a first counting register 40, hereinafter referred to as the "display register," and a second counting register 41, hereinafter referred to as the "scanning register."

The scanning register 41 is continuously counted on a cyclical basis by a high frequency clock 42 over line 43, typical clock frequency being 20,000 Hz. The display register 40 is counted up by appropriate incrementing pulses received over line 44 at a frequency no greater than the complete cycling frequency of the scanning register 41, typically 100 Hz.

The output of the display register 40 is appropriately directed to a display decoding and multiplexing subsystem 45 of conventional design, the output of the latter subsystem being, in turn, fed to an appropriate output digital display unit 46 so that measured temperatures are displayed directly in easily read form.

Basically, the display register 40 and scanning register 41 cooperate with each other to modulate the state of balance of a bridge network 47, including a thermistor 48, to selectively increment the display register so that it counts up as the thermistor temperature increases.

The display register 40 and scanning register 41 may be any digital counters known in the art. For convenience, however, in a presently preferred embodiment of the invention, each of these registers 40 and 41 comprise a pair of decades and a divide by two flip-flop to provide each register with a 200 count capacity. The reason for this is the desire to cover the temperature range between 94°F and 108°F in 0.1° intervals, requiring a total of 140 counts. Hence, a 200 count binary coded decimal register, using two decades and a single flip-flop, is a very simple, easy and economical digital counting means for providing the desired count capacity of 140 steps between 94° F and 108° F. However, any other counters, such as conventional binary counters, with the desired count capacity may be used.

The bridge network 47 includes a bridge having resistances $R_A$, $R_B$, $R_T$ and $R_{BAL}$ electrically connected in a d.c. Wheatstone bridge configuration, with the electrical output of the bridge available at terminals 49, 50. Resistance $R_A$ and $R_B$ are reference resistances, while resistance $R_T$ is the resistance of a thermistor whose impedance varies with temperature. By way of example, the thermistor 48 is presumed to have a negative temperature coefficient, so that its resistance $R_T$ decreases with increasing thermistor temperature. However, it is to be understood that the same system may be employed for positive temperature coefficient transducers, wherein resistance increases with increasing temperature, the only difference being in whether resistance must be added or removed to restore balance in the bridge with changing temperature.

$R_{BAL}$ is the basic resistance in the balancing arm of the bridge, the total resistance in the bridge balancing arm being cyclically varied by varying the on and off duty cycle of a shunt resistance $R_C$ which is electrically connected in parallel with the resistance $R_{BAL}$ whenever a switch 51 is closed. The switch 51 is typically a solid state switch in the form of a bi-polar or field effect transistor which is turned on or off by the presence or absence of an enabling input over line 52 from a switch flip-flop 53.

The switch flip-flop 53, switch 51 and, hence, the duty cycle of the resistance $R_C$, is controlled by the constantly compared states of the display register 40 and scanning register 41 to modulate the state of balance of the bridge network 47 by varying the period of time that the resistance $R_C$ is connected into the balance arm of the bridge. In this regard, the ratio of closing to open time for the switch 51 and, hence, the ratio of time in to time out for the resistance $R_C$, is representative of the count in the display register 40. Hence, the net resistance in the bridge balancing arm is selectively varied by the state of the display register 40, in a manner to be hereinafter described, so as to reduce the electrical output of the bridge network and thereby correlate the count in the display register with the resistance $R_T$ representing the temperature being measured.

In a presently preferred embodiment of the invention, the resistance $R_{BAL}$ is made of higher resistance magnitude than that normally required to balance the bridge, so that the balancing arm of the bridge and the display register 40 are out of phase by the equivalent of a predetermined temperature differential, i.e., the display register is driven to a higher counter state than would ordinarily be dictated by the actual thermistor temperature, in order to compensate for the additional resistance in the balancing arm. Hence, the temperature stored in the display register 40 and indicated by the digital display 46 leads the actual temperature of the thermistor 48 by the predetermined temperature differential. It can be readily ascertained empirically, for any given thermistor probe, how the rate of change of temperature varies with time, and the latter is correlated with the time period between incrementing pulses passed over line 44 to the display register 40 to determine when the actual thermistor temperature differs from its final stable temperature by the aforedescribed predetermined temperature differential. In this connection, the time interval between incrementing pulses passed to the display register 40 is monitored over line 52 by a suitable anticipation subsystem 53 and, when the pulse periods reach the proper magnitudes, a suitable control subsystem 54 is informed by the anticipation subsystem over line 55, the latter control subsystem then gating off further counting pulses and freezing the display register 40 and its associated display 46 at an indication representing the anticipated final temperature of the thermistor 48.

As previously indicated, the on-off duty cycle of the resistance $R_C$ is controlled by the switch 51 which, in turn, is under the control of the switch flip-flop 53. The switch 51 is closed, to insert the shunt resistance $R_C$ into the balancing arm of the bridge whenever the flip-flop 53 is in its 1 state, and the switch is opened to disconnect the resistance $R_C$ from the bridge whenever the flip-flop is in its 0 state. The state of the switch flip-flop 53 is, in turn, controlled by the states of the display register 40 and the scanning register 41. In this regard, the state of the scanning register 41 is decoded by a decoder 56 which decodes out a preselected reference state of the scanning register for control purposes. Normally, the reference state is the "zero" count of each cycle of the scanning register 41 and, hence, the decoder 56 is, in such instances, referred to as a zero detector.

The zero detector 56 provides one enabling input over line 57 to an AND gate 58. The gate 58 also receives an input over line 59 from a threshold detector 60 which evaluates the level of output, on a cycle by cycle basis, from a dual ramp integrator 65 in the bridge network 47.

Assuming conditions are such that the threshold detector 60 provides an enabling input to the gate 58, then, each time the scanning register 41 counts to its zero state to begin a new scanning cycle, the output of the zero detector 56 over line 57 will generate an output over line 61 from the gate 58 to set the switch flip-flop 53 to its 1 state and thereby connect the resistance $R_C$ into the bridge balancing arm.

A coincidence detector 62 constantly compares the states of the display register 40 and the scanning register 41 and, each time the two registers are equal, the detector 62 generates a coincidence output over line 63 to set the switch flip-flop 53 into its 0 state, and thereby disconnect the resistance $R_C$ from the balancing arm of the bridge.

Hence, the switch flip-flop 53 gets set to its 1 state every time the scanning register reaches zero, thus gating the switch 51 on. The flip-flop 53 gets reset to its 0 state every time the scanning register has the same count as the display register, thus gating the switch 51 off. The switch 51 is thereby periodically turned on and off, once for every full count cycle (200 counts) of the scanning register 41. The on-off duty cycle of the switch 51 and, hence, the ratio of time in to time out of the resistor $R_C$ depends on the count in the display register 40, the higher the count, the longer the on period and the shorter the off period.

Thus, the switch flip-flop 53, switch 51 and shunt resistance $R_C$ in the balancing arm of the bridge network 47 are modulated by the relative state of the display register 40 and scanning register 41 so that the resistance $R_C$ is in the bridge when the scanning register count is between zero and the display register count, the resistance being connected out of the bridge whenever the scanning register has a count higher than that of the display register. In this way, the electrical output of the bridge network 47 varies in accordance with the count in the display register 40.

The electrical output of the bridge at terminals 49, 50 is directed as input to the dual ramp integrator 65 used as a bridge detector. The dual ramp integrator 65 consists of a d.c. operational amplifier 66, and a conventional integrating capacitor 67 connected between the negative input of the amplifier 66 and the amplifier output. The terminal 49 of the bridge is connected to the positive input of the amplifier 66, while the terminal 50 of the bridge is connected to the negative input of the amplifier.

The output of the dual ramp integrator 65 is directed over line 68 to the threshold detector 60 which monitors the state of the ramp output from the integrator and thereby selectively enables the gate 58 over line 59 for control of the switch flip-flop 53.

The output of the threshold detector 60 is also directed over line 70 as input to the control subsystem 54. The latter control subsystem also receives input over line 71 from the zero detector 56 and, further, receives input from the anticipation subsystem 53 over line 55. The control subsystem evaluates all of these inputs, in a manner to be subsequently described in detail, and thereby provides an output over line 72 which selectively enables an AND gate 73 to pass incrementing pulses via line 44 to the display register 40. These incrementing pulses essentially occur as a result of the output of the zero detector 56 which is also provided as input over line 74 to the AND gate 73. Each time the zero detector provides an output level when the scanning register 41 is in the 0 state, the latter decoded state, which lasts for a single clock pulse interval, is used to pulse the display register 40 through the AND gate 73. Alternatively, the output of the gate 73 can be used as an enabling input to a second AND gate (not shown) to selectively gate clock pulses into the display register 40 for counting purposes.

The control subsystem 54 not only receives information from the anticipation system 53 but also directs timing information to the anticipation subsystem 53 over line 76.

When the thermometer is initially turned on, a "reset start" subsystem 78 generates a pulse or brief duration d.d. level over line 79 which resets the display register 40 to a count of 040 representing 94°F., resets the scanning register 41 to zero, sets the switch flip-flop 53 to the 0 state, and also directs appropriate resetting input to the anticipation subsystem 53 and control subsystem 54.

The thermometer system shown in FIG. 2 always starts initially in the anticipation mode of measurement and remains in the anticipation mode if the resistance $R_T$ of the thermistor 48 indicates a lower thermistor temperature at the beginning of the measurement cycle than the initial setting of the net resistance in the balancing arm of the bridge network 47.

Since the reset subsystem 78 initially sets the display register 40 to 94°F., and assuming an anticipation correction temperature differential of 1°F., the thermometer system will remain in the anticipation mode only if the initial temperature of the thermistor is less than 93°F., as is usually the case. However, in the event the thermistor 48 is initially at a temperature in excess of 93°F., at the beginning of a measurement cycle, then the control subsystem 54 closes a normally open switch 81, via line 82, to insert an additional extended mode resistance $R_D$ in parallel with the resistance of the balancing arm in the bridge network 47.

The switch 81 is typically of the same type as the switch 51 and is referred to as an "extended mode switch" since the insertion of shunt resistance $R_D$ into the balancing arm of the bridge reduces the total balancing arm resistance, and thereby cancels out the initial added resistance included in $R_{BAL}$, as previously indicated, for anticipation purposes. Hence, the bridge network 47 and the display register 40 are no longer offset by the equivalent of a 1°F. temperature differential once the resistance $R_D$ has been connected into the bridge. In this regard, the count registered in the display register 40 is 1°F. lower than would ordinarily be dictated by the anticipation mode of operation, in order to compensate for the additional shunt resistance $R_D$ in parallel with the bridge balancing arm. Hence, the temperature indicated by the counter display 46, when the thermometer is in the extended mode of operation, no longer leads the thermistor temperature by an anticipation temperature differential, but rather displays the actual temperature of the thermistor 48.

The manner in which the dual ramp integrator 65 and threshold detector 60 operate to indicate the relative states of the thermistor temperature 48 and the count registered in the display register 40, to determine whether or not additional count pulses should be gated to increment the display register 40, is best understood by reference to the waveforms of FIG. 5.

The upper waveform in FIG. 5a represents the output voltage of the integrator 65 across the integrating capacitor 67. The middle waveform diagram in FIG. 5b indicates the state of the switch 51 which connects the shunt resistance $R_C$ into and out of the bridge balancing arm, as the switch state varies in accordance with the dashed line ramps in FIG. 5a. FIG. 5c is a waveform similar to FIG. 5b, but for the solid line ramps of FIG. 5a.

Referring to FIG. 5, with the switch 51 open and the resistor $R_C$ disconnected from the bridge, and with the thermistor 48 at a temperature in excess of 93°F., the bridge network 47 is unbalanced in such a direction that the output of the operational amplifier 66 is at one defined region of saturation shown as a positive saturation level 80. The switch 51, together with the resistance $R_C$ always causes the bridge to be unbalanced in either one direction or the other in a consistent manner for the normal measurement range of the system. In other words, when the switch 51 is open, the bridge is unbalanced in such a direction that the output of the operational amplifier 66 always attempts to go to positive saturation. On the other hand, when the switch 51 is closed, and the resistance $R_C$ is connected into the bridge, and the output of the operational amplifier 66 seeks a negative saturation level. Hence, the switch 51 and resistance $R_C$ always introduce a known imbalance into the bridge, while the thermistor 48, by virtue of its changing temperature, introduces a variable imbalance into the bridge which manifests itself as a shift in the slope of the output voltage ramps from the integrator 65.

Thus, the switch 51 and resistance $R_C$ determine the relative durations of the negative going and positive going output voltage ramps from the integrator 65, whereas the temperature of the thermistor 48, by virtue of the variation in the resistance $R_T$, varies the slope of the ramps.

When the switch 51 has been opened for some time, the operational amplifier 65 is at its positive saturation point. When the switch 51 is closed, at the time when the scanning register goes through zero, the bridge is unbalanced in such a way that the integrator 65 generates a negative going ramp having a slope determined by the temperature of the thermistor 48 which sets the actual input voltage on the positive input of the operational amplifier 66. The duration of the negative going ramp is determined by the presently displayed count in the display register 40, since that count determines how long the switch 51 is closed. When the scanning register 41 is counted up to the same count as the display register 40, the switch 51 is opened again, which causes the resistance $R_C$ to be disconnected from the bridge, and unbalances the bridge in the opposite direction, whereby a positive going voltage ramp is generated whose slope is also dependent on the temperature of the thermistor 48.

Depending upon whether or not the output voltage ramp of the integrator 65 has returned to the positive saturation level 80, the next time that the scanning register goes through zero, a decision is made as to whether or not the count is high enough in the display register 40. If the ramp has returned to the positive saturation level when the scanning register is zero, the count in the display register is too low, i.e., the time period for the negative going ramp has not been long enough since, the longer the switch 51 is closed, the more negative the first ramp will go, and, of course, the longer it will take for the positive ramp to come back up to the positive saturation level. If the time period is shorter for the first ramp than it should be, so that the second positive going ramp has returned to the positive saturation level when the scanning register is zero, an appropriate signal will be generated within the control subsystem 54 over line 72 to gate 73 to enable the output pulse from the zero detector 56 to add one count into the display register 40. At the same time, since the scanning register is passing through zero, the switch 51 is again closed to generate a new ramp which will be on for one more clock pulse than the initial ramp for the previous counting cycle, and it will take one more clock count for the scanning register 41 to come up to equality with the display register 40.

As soon as the display register 40 has reached a count which is slightly larger than the actual temperature represented by the bridge network, the ramp output of the integrator 65 will not have returned to its positive saturation point at the time that the scanning register 41 goes through zero. This failure to return to the positive saturation point is recognized by the threshold detector 60 which advises the control subsystem 54 accordingly so that gate 73 blocks the zero detector pulse over line 74 and prevents any additional counts from being entered into the display regsiter 40, thus holding the display register at the last temperature indicated. In addition, the failure of the ramp to return to positive saturation as the scanning register goes through zero, causes the zero detector pulse over line 57 to be blocked by the gate 58, whereby the switch flip-flop 53 is maintained in a 0 state so that a new ramp cannot be generated until the next point in time where the scanning register goes through zero and the ramp has returned to positive saturation.

Referring now to FIG. 5a of the drawings, assume that the output of the integrator 65 starts out at its positive saturation level 80. At the time the scanning register goes through zero, the switch 51 is closed and the output voltage of the operational amplifier 66 goes negatively in a linear fashion indicated by the linear ramp 81. When the scanning register count equals the display register count, the switch 51 is opened again and the output voltage of the integrator follows the linear ramp 82 back up to the positive saturation level 80 before the next time that the scanning register goes through zero. The return to the positive saturation level indicates that the display register count is too low, and, hence, an additional count is added to the display register. At the same time, the switch 51 is closed again to generate another negative going ramp 83, which will be longer, by one clock pulse period, than the duration of the previous ramp 81. When the scanning register 41 equals the display register 40 again, a new positive ramp 84 is generated to bring the output voltage up to the saturation level 80. The state of the switch 51 for these cycles is illustrated by the waveform of FIG. 5b.

Again, referring to FIG. 5a, assume that the temperature indicated by the display register 40 has been higher than the actual temperature represented by the bridge network 47. In that case, a negative going ramp 85 would be generated which will reach a more negative voltage level during the on period of the switch 51 than the ramp 81 previously discussed and, accordingly, the positive going ramp 86 generated when the switch 51 is opened, will not have reached the positive saturation level 80 the next time the scanning register goes through zero, thereby preventing the display register 40 from being incremented by the system of FIG. 2. At the same time, referring to the lower waveform of FIG. 5c for the switch 51, since the ramp 86 does not bring the output of the integrator 65 back up to positive saturation at the time when the scanning register goes through zero, the switch 51 is held open and is not again closed until the ramp has, in fact, returned to positive saturation. After the latter return to positive saturation, the very next time the scanning register goes through zero, a new negative ramp 87, followed by its associated positive going ramp 88 can be generated. It will be apparent from FIG. 2, that the switch 51 is held open because of the failure of the switch flip-flop 53 to be set to the 1 state, as a result of the threshold detector 60 having gated off the zero detector pulse by failing to enable AND gate 58.

The dual ramp integration approach to evaluation of the state of balance of a bridge enables very rapid, cycle by cycle, analysis of the relative states of the display register 40 and the temperature of the thermistor 48. In addition, since the entire evaluation by the threshold detector 60 takes place over a single cycle of the scanning register 41, or 0.01 seconds, the threshold detector need be stable for only one integration period at a time. Hence, the detector 60 can be of relatively simple circuit design, with freedom to shift with temperature on a long term basis, without effecting the accuracy of the evaluation system.

Referring again to FIG. 2, it has previously been indicated that the count in the display register 40 leads the actual temperature of the thermistor 48, when the thermometer is operating in the anticipation mode, due to an increase in the magnitude of the $R_{BAL}$ resistance. However, it will be appreciated that other techniques may be employed in the system of FIG. 2 to introduce the desired anticipation of temperature. For example, instead of decoding out the zero state of the scanning register 41, the switching flip-flop 53 and switch 51 can be activated at a different reference state of the scanning register. If the decoder 56 decodes out the 005 state of the scanning register 41, then a 0.5°F. offset would be introduced into the thermometer system to cause the display register 40 to lead the temperature of the thermistor 48 by that temperature differential. Similarly, if the decoder 56 decodes out the 010 state of the scanning register as the reference state for switching the resistance $R_C$ into the bridge, then a 1.0°F. anticipation temperature differential would be introduced into the thermometer system.

Referring now to FIG. 3 of the drawings, the anticipation subsystem 53 includes a pair of digital timers, an elapsed timer 90 and a pulse interval timer 91. The elapsed timer 90 is a counting register which counts time elapsed during a monitoring period which starts from a predetermined reference point in each measurement cycle, e.g., when the display register 40 receives its first counting pulse to increment the display register above its starting point of 94°F.

The electrical state of the elapsed timer 90 is directed over a plurality of lines 92 to a suitable decoder 93 having a pair of output lines 94, 95 which go "true" in various combinations depending upon the elapsed monitoring period registered by the time 90. For example, in a preferred embodiment, the output of the decoder 93 over both lines 94 and 95 is "false" whenever the elapsed time in the monitoring period is less than 13 seconds. When the elapsed time is 13 seconds or more, but less than 23 seconds, line 94 will go "true," while line 95 will remain "false." When the elapsed time is 23 seconds or more, both lines 94 and 95 will be "true."

Elapsed timer 90 is clocked by the 0.01 second cycle increments of the scanning register 41 each time the scanning register goes through zero, but only if the prescribed reference point conditions have first been met, e.g., the conditions for feeding a first counting pulse to the display register 40. The latter determination is made in the control subsystem 54 and, hence, elapsed timer 90 is shown in FIG. 3 as being incremented by pulses over line 96 from gate 122 of the control subsystem. Similarly, the control subsystem 54 counts up the pulse interval timer 91 over line 97.

Both the elapsed timer 90 and the pulse interval timer 91 are initially set to zero by the reset subsystem 78 over lines 98, 99, respectively.

The pulse interval timer is a counting register which counts the pulse interval between each pair of pulses which increment the display 40. In this regard, the pulse interval timer 91 is reset over line 52 each time a pulse adds a count to the display register.

The electrical state of the pulse interval timer 91 is directed over a plurality of lines 102 to a conventional decoder 103 which decodes out a pair of pulse periods $T_1$ and $T_2$, as they occur, over output lines 104, 105, respectively, which are directed to the control subsystem 54 for evaluation to determine wheather or not the measurement cycle should be terminated. The outputs $T_1$ and $T_2$ are reset on each display register incrementing pulse, just as is the pulse interval timer 91. In this regard, in accordance with a safeguard technique, a prescribed pulse period sequence, e.g., a pair of pulse periods of prescribed magnitudes is required for proper termination of a measurement cycle.

In accordance with the invention, a variable anticipation correction and a pulse period sequence safeguard technique are utilized to make the temperature measurement less dependent on operating techniques. In this connection, the pulses over line 52 are monitored by the interval timer 91 and the particular pulse rate searched for is selectively altered during a measurement cycle as a function of the elapsed monitoring period for the measurement cycle, as measured by the elapsed timer 90. Alternatively, if the pulse rate searched for is held constant, then the magnitude of the correction increment added by the anticipation network is a function not only a rate of change of temperature but also of elapsed monitoring period for the measurement cycle. In addition, in order to compensate for possible loss of tissue contact during a measurement cycle, the temperature measurement system will not certify the final output indication unless the indication is made after certain pulse sequence conditions have been met. In this regard, a plurality of successively increasing pulse periods $T_1$ and $T_2$, in excess of a prescribed pulse interval, are required before the measurement cycle is terminated. This prevents any error due to loss of tissue contact where the period of loss contact exceeds the termination pulse period interval searched for and would thus cause a corresponding false termination of the measurement cycle. Hence, the safeguard network is a resetting subsystem requiring a prescribed sequence of pulse periods for proper completion of the measurement cycle and thereby minimizes false readings which might otherwise be provided by poor measurement technique of operating personnel.

The safeguard subsystem, partially illustrated in FIG. 3, searches for two time periods in sequence, a first pulse period $T_1$ somewhat shorter than the pulse period normally indicating termination of the measurement cycle, followed by a second pulse period $T_2$ at least equal to the termination determining pulse period duration. The search for the second pulse period $T_2$ does not begin until the first pulse period $T_1$ has occurred. If a pulse period shorter than the first pulse period $T_1$ occurs after the first pulse period has been detected, the safeguard subsystem is reset and again searches for the first pulse period $T_1$ rather than the second pulse period $T_2$, thereby again requiring a double pulse period sequence of prescribed magnitudes as though the first pulse period $T_1$ had not been detected at all during the measurement cycle.

In addition, since the magnitude of the anticipation correction is a function not only of rate of change of measured temperature, but also of elapsed time from the prescribed reference point in a given measurement cycle, the magnitude of the particular pulse periods $T_1$ and $T_2$ searched for is increased with increasing elapsed time.

A previously indicated, in accordance with the invention, the magnitudes of the particular pulse periods searched for, assuming a fixed anticipation correction temperature differential, are varied as a function of elapsed time. Hence, the pulse periods $T_1$ and $T_2$ decoded out of the decoder 103 over lines 104, 105 must change as a function of the time registered by the elapsed timer 90. This may be implemented in any one of several conventional approaches well known in the art. By way of example, the outputs 94 and 95 from the elapsed timer decoder 93 are directed as inputs to the pulse interval timer 91, which is essentially a resettable digital counter, to change the counter modulus at preselected times in the measurement cycle. For example, when the elapsed time is 13 seconds or less, the counter modulus for the timer 91 is 128. When the elapsed time is between 13 seconds and 23 seconds, the counter modulus is changed to 192. When the elapsed time is 23 seconds or more, the counter modulus of the interval timer 91 is again changed from 192 to 256. Such counters with variable counter modulus capability are well known.

The effect of changing the counter modulus of the timer 91 is to change the magnitude of the pulse periods decoded out over lines 104 and 105 from the decoder 103. For example, when the counter modulus of the interval timer 91 is 2, the pulse periods $T_1$ and $T_2$ are 1.0 and 1.3 seconds, respectively. When the counter modulus is changed to 3, the times $T_1$ and $T_2$ are decoded out over lines 104, 105 as 1.5 and 2.0 seconds, respectively. When the elapsed time is 23 seconds or more, and the counter modulus of the timer 91 is changed to 4, the output lines 104, 105 go "true"

at 2.0 and 2.6 seconds, respectively.

An alternative means for altering the magnitudes of the pulse periods $T_1$ and $T_2$, instead of altering the counter modulus of the timer 91, is to utilize the output of the decoder 93 over lines 106, 107, (shown dashed in FIG. 3) to directly condition the decoder 103 and alter the decoder state as a function of elapsed time. In this regard, the decoder 103 may be typically include three gates capable of registering six different states, i.e., three sets of double pulse period magnitudes for $T_1$ and $T_2$.

Referring now to FIG. 4 of the drawings, the control subsystem 54 includes a control register 110, a plurality of AND gates 112–122, OR gates 124–127, inverters 129–131, and an "ADD" flip-flop 133.

The purpose of the control subsystem 54 is to coordinate the analog to digital converter and bridge network of FIG. 1, including the output of the threshold detector 60, with the anticipation subsystem 53 (FIG. 3) to insure timely and proper incrementing of the display register 40 and proper termination of the temperature measurement cycle.

The control register 110 establishes the various operating phases of each temperature measurement cycle, for both the anticipation and extended modes of operation.

The ADD flip-flop 133 always indicates the state of the ramp i.e., the state of the threshold detector 60 in FIG. 1, at the end of the previous scanning register counting cycle. If the threshold detector output is "true," it indicates a "ramp not busy" state. If the output of the threshold detector is "false," it indicates a "ramp busy" state. The reason for such an indication by the AND flip-flop 133 is that the ramp must be tested twice in succession, as the scanning register 41 goes through zero, in order to place the AND flip-flop in its 1 state. The reason for this is to make sure that a "ramp not busy" state of the threshold detector 60 is not merely a remainder from a previous "ramp busy" signal that took more than one scanning register cycle to return to the positive saturation level of the integrator 65 (See FIG. 5). Therefore, the evaluation of the ramp for determining wheather or not a counting pulse should be directed to the display register 40, is made in double cycle groupings, wherein the ramp is checked not only for its state as the scanning register passes through zero in a present cycle but also where the ramp was when the scanning register went through zero in the immediately preceding cycle. One complete cycle after the scanning register goes through zero and the AND flip-flop 133 has initially been set to its 1 state, the decision is made as to whether or not a true ramp return is in a single scanning register cycle has been accomplished, so that a counting pulse to the display register 40 is warranted.

The control subsystem 54 receives the following inputs:

1. The output from the zero detector 56 (FIG. 2) over line 71;
2. The output from the threshold detector 60 (FIG. 2) over line 70; and
3. The output over lines 104, 105 from the decoder 103 (FIG. 3) representing the pulse periods $T_1$ and $T_2$.

The control subsystem 54 provides the following outputs:

1. A conditioning input over line 72 to gate 73 (FIG. 2);
2. An enabling output over line 82 for the extended mode resistance switch 81 (FIG. 2);
3. A cycle termination and read light activation signal over line 135; and
4. Incrementing input over lines 96, 97 to the elapsed timer 90 and pulse interval timer 91 (FIG. 3).

The control register (CR) 110 consists essentially of a plurality of flip-flops (not shown), of conventional design capable of providing six unique output states in the form of d.c. levels denoted as control register states 0, 1, 2, 3, 4, and 5, respectively. These d.c. level outputs representing the control register states are provided over lines 140, 141, 142, 135 and 82, respectively. The control register output states are set by a corresponding group of pulse input lines 0, 1, 2, 3, 4, 5, respectively, indicated in FIG. 4 as lines 150, 151, 152, 153, 154, 155, respectively.

The operational significance of the various control register states is set forth as follows:

CR = 0 indicates the reset mode for initially starting a temperature measurement cycle and calls for the system to wait for the scanning register 41 to go through zero, to determine whether or not the system should be placed in the extended mode or anticipation mode of operation, depending upon whether or not the initial temperature of the thermistor 48 is greater or less than 93°F. at the beginning of the temperature measurement cycle.

CR = 1 indicates the beginning of the anticipation mode of operation, wherein it has been determined that the initial temperature of the thermistor 48 is below 93°F., and the measurement system is waiting for the first incrementing pulse to the display register 40. The purpose of the CR = 1 state is to ignore the time period it takes for the thermistor 48 to come up to the reference temperature (thermistor at 93°F. with 94°F. indicated by the display register), to enable the measurement system to start counting.

CR = 2 represents the anticipation mode state wherein a search is being conducted for the first pulse period $T_1$ of the pair of pulses required by the safeguard sequence.

CR = 3 represents the anticipation mode search for the second pulse period $T_2$ of the pair of pulse periods required by the safeguard sequence.

CR = 4 occurs only after the $T_1$ and $T_2$ pulse period requirements of the safeguard sequence have occurred. The CR = 4 state calls for adding one more count to the display register 40, turning on a read light 156, and terminating the temperature measurement cycle.

CR = 5 represents the extended mode of temperature measurement operation which can be achieved only if the evaluation made during the CR = 0 state indicates that the starting temperature of the thermistor is above the 93°F. reference point. A CR = 5 state locks out the anticipation mode of operation and counts up the display register 40 without any anticipation correction, so that the display register count no longer leads the thermistor temperature by a temperature differential.

The reset subsystem 78 sets the CR = 0 state of the control register 110 by directing a reset input over line 150. A reset input is also directed over line 160 through the OR gate 124 or reset the ADD flip-flop 133, via line 161, to the 0 state of the ADD flip-flop.

The output from the zero detector 56 and the threshold detector 60 are directed as inputs over lines 71 and 70, respectively, to the AND gate 112, the "true" output of the gate 112 representing a "ramp not busy", and scanning register going through zero, signal. The "true" output of the gate 112 over line 163 sets the ADD flip-flop 133 to its 1 state, the ADD flip-flop being a conventional JK flip-flop. Hence, when the ADD flip-flop input over line 163 goes "true", the flip-flop does not get set into its 1 state until the next clock pulse occurs.

The 1 state of the ADD flip-flop 133 is fed over line 164 as an enabling input to the AND gate 113 which also receives, over line 162, the output of the AND gate 112. Hence, a "true" output from the AND gate 113 over line 166 indicates that the scanning register is going through zero, the ramp is not busy, and the AND flip-flop 133 is in its 1 state meaning that the ramp was not busy on the previous cycle when the scanning register went through zero.

The output of the zero detector 56 is also directed as input over line 167 to an AND gate 114. The output of the threshold detector 60 is directed over line 168 to an inverter 129 whose output provides a second input, over line 169, to the AND gate 114. The "true" output of the AND gate 114 over line 170, representing a "ramp busy," while the scanning register is going through zero, condition is passed through the OR gate 124 to reset the ADD flip-flop 133 to its 0 state.

The output of the threshold detector 60 is also directed over line 171 as one input to the AND gate 121, the latter gate receiving as a second input, over line 172, the 1 state of the ADD flip-flop 133. A third input to the AND gate 121, over line 173, is the output of the inverter 131 which receives as input the CR = 4 state on line 135. Hence, a "true" output, over line 175, from the AND gate 121 represents the conditions that the control register is not in state 4, the ramp is not busy, and the ramp was also not busy when the scanning register through zero in the preceeding scanning register cycle. The output of the AND gate 121 passes through the OR gate 125, over line 72, to enable a counting pulse to be passed by the AND gate 73 (FIG. 2) to the display register 40 when the zero detector 56 indicates that the scanning register 41 is going through zero.

The CR = 0 state on line 140 provides one input to the AND gate 115 which receives a second input, over line 170, from the AND gate 114. Hence, the "true" output of the AND gate 115 indicates CR = 0, the ramp is busy (meaning that the thermistor 48 is at a lower temperature than the count in the display register 40), and the scanning register is going through zero. These conditions set the control register 110 into its 1 state representing initiation of the anticipation mode of operation.

The CR = 1 state on line 141 provides one input to the AND gate 116, the latter gate receiving a second input from the AND gate 113 over line 166, so that a "true" output of the gate 116 represents CR = 1, the ramp is not busy, the ADD flip-flop 133 is in its 1 state, and the scanning register is going through zero. The "true" output of the AND gate 116 is passed through OR gate 127 to set the control register 110 into its 2 state which initiates the search for the first pulse period $T_1$.

Under these conditions, incrementing pulses are not only passed to the display register 40 by the gate 73 in FIG. 2, but incrementing pulses are also passed to the elapsed timer 90 and pulse interval timer 91. In this regard, the CR = 2 state over line 142 is passed by the OR gate 126, as is the CR = 3 state over line 143, to provide one enabling input over line 180 to the AND gate 122, the other enabling input to the gate 122 being provided over line 181 from the zero detector 56 each time the scanning register 41 goes through zero.

The CR = 2 state also provides one input to the AND gate 118 which receives a second input, over line 104, representing the pulse period $T_1$ and a third input, over line 182, from the AND gate 113. Hence, the "true" output of the AND gate 118 sets the control register 110 to its 3 state when CR = 2, the ramp is not busy, the ADD flip-flop 133 is in its 1 state, the scanning register is going through zero, and the last pulse period interval measured was at least equal to $T_1$.

In accordance with the safeguard sequence technique of the present invention, if a pulse period occurs which is shorter than the pulse period $T_1$, after the control register is in its 3 state, as would occur if tissue contact is lost and subsequently reacquired, the system should switch back to the CR = 2 state and again search for the pulse period $T_1$. In this regard, the AND gate 117 receives an input over line 183 representing CR = 3, an input over line 184 which is the output of the inverter 130 and represents a pulse interval less than $T_1$, and an input over line 185 from the AND gate 113 representing ramp not busy, the ADD flip-flop is in its 1 state, and the scanning register is going through zero. The "true" output of the gate 117 is passed through OR gate 127 to reset the control register 110 to its 2 state.

The AND gate 119 receives an input over line 87 representing CR = 3, an input over line 188 indicating a pulse interval has elapsed greater than the required pulse period $T_2$, and a third input, over line 189, from the gate 114 indicating that the ramp is busy and the scanning register is going through zero. The "true" output of the AND gate 119 sets the control register 110 to its 4 state which energizes the read light 156 over line 135. In addition, the "true" output of the gate 119 on line 154 is directed over line 190 through the OR gate 125 to enable the AND gate 73 in FIG. 2 so that one last incrementing pulse is passed to the display register 40 for the final temperature indication. The reason for this is to avoid having to delay termination of the measurement cycle until the inevitable last counting pulse actually comes along in the conventional ramp evaluation system, since this might typically waste several additional seconds in the temperature measurement cycle.

With regard to the extended mode of operation of the thermometer system, the AND gate 120 receives one input over line 140 representing CR = 0, and receives a second input, over line 191, from the output of the AND gate 113 indicating that the AND flip-flop is in its 1 state, the ramp is not busy and the scanning register is going through zero, indicating that, in the initial reset mode of the thermometer system, the starting temperature of the thermistor 48 is above the reference point of 93°F. Hence, the "true" output of the AND gate 120 sets the control register 110 to its 5 state which, in turn, causes the extended mode offset switch 81 (in FIG. 2) to be energized over line 82.

Figure 6:
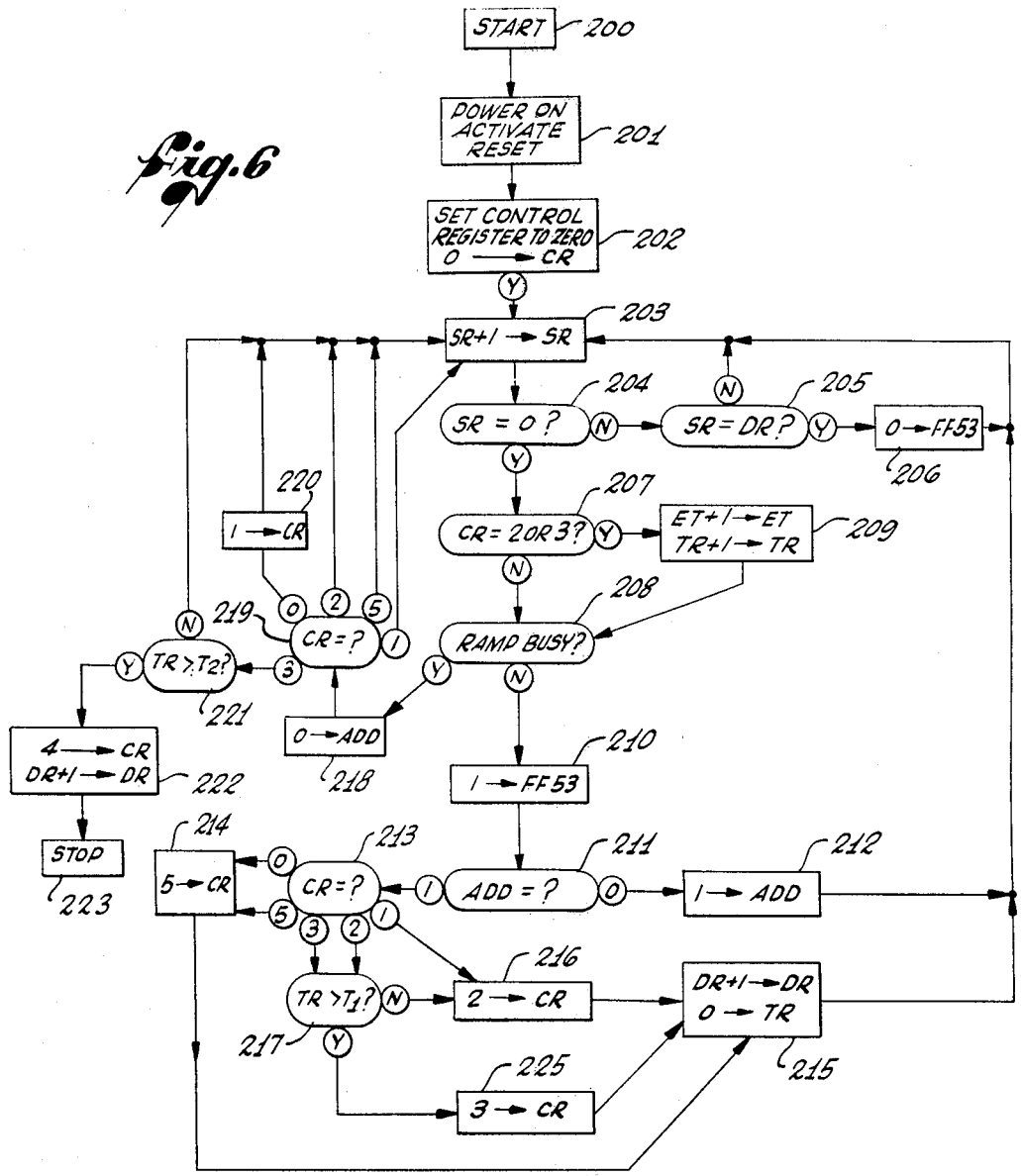
FIG. 6 is a flow chart for an algorithm describing the handling of data in practicing the invention with the electronic thermometer system set forth in FIGS. 2, 3 and 4.

Referring now to FIG. 6 of the drawings, the algorithm for data processing to make a temperature measurement, as embodied by way of example in the system and subsystems shown in FIGS. 2 thruogh 5, is diagrammed.

A start step at 200 initiates application of power and turning on of the reset subsystem 78 by step 201. This causes the elapsed time and pulse interval timers and scanning register to be set to zero, the switch flip-flop 53 (FIG. 2) and ADD flip-flop 133 (FIG. 4) to be set to zero, and the display register count to be set to 040 representing 94°F. It also initates the next step 202 wherein the control register is set to 0.

In the next step 203, one count is added to the scanning register and the question is asked at 204 whether or not this brings the scanning register to zero. If the answer is no, the question is asked at 205 whether or not the scanning register is equal to the display register. If the answer to the question at 205 is yes, then the switch flip-flop (FIG. 2) is first set to 0 before returning to step 203 and adding another count to the scanning register.

On each cycle of the scanning register, when the answer to the question 204 is yes, (indicating the scanning register is at zero count), the question is asked at 207 whether the control register is in either of the states 2 or 3. If the answer is no, the question is asked at 208 "is the ramp busy?" If the answer to question 207 is yes, the elapsed timer 90 and pulse interval timer 91 are first incremented by one count in step 209, before determining the state of the ramp at 208.

If the ramp is not busy, then the switch flip-flop 53 is set to its 1 state in step 210. The question is then asked at 211 "what is the state of the ADD flip-flop 133?" (FIG. 4). If the ADD flip-flop is in its 0 state, the ADD flip-flop is set to its 1 state in step 212 and return is made to step 203 to increment the scanning register and continue with the next cycle.

If the answer to question 211 is that the ADD flip-flop is in its 1 state, then a question is asked at 213 regarding the state of the control register. If the control register is 0 the control register is set to its 5 state in step 214 which then increments the display register by one count and resets the interval timer to zero by step 215 before returning to step 203 to begin another scanning register cycle.

If the answer to question 213 is that the control register is already in the 5 state, then the control register remains unchanged in step 214 and proceeds on through step 215 and back to step 203. If the control register is in the 1 state, the control register is set to its 2 state in step 216 and then proceeds with steps 215 and 203. If the control register is in either the 2 or 3 state, a determination is made at 217 whether or not the pulse interval timer registers a period greater than the pulse period $T_1$. If the answer is no, then the control register remains in its 2 state, or is reset to the 2 state if it was already in the 3 state, by step 216. If the pulse interval timer does register a pulse period greater than $T_1$, then the control register is set to its 3 state by step 225.

If the answer to question 208 is that the ramp is busy, meaning that the threshold detector 60 had not come up to the positive saturation level of the integrator 65 when the scanning register went through zero, then the ADD flip-flop 133 is set to zero by step 218. The status of the control register is then queried at 219. If the control register is 0, the control register is set to its 1 state and return is made to step 203 to continue with a scanning register cycle.

If the control register is in either its 1, 2 or 5 states, then return is made immediately to step 203 to increment the scanning register by one clock pulse.

If the answer to question 219 is that the control register is in its 3 state, then a determination is made at 211 whether or not the pulse interval timer registers a pulse period greater than the period $T_2$. If the answer is no, then return is made to step 203. If the answer is yes, then the control register is set to its 4 state and a single count is added to the display register, in step 222, followed by termination of the measurement cycle in step 223.

It will be apparent that, while the algorithm flow chart illustrated in FIG. 6 has been specifically related, for purposes of illustration, to the system and subsystems of FIGS. 2 through 5, it is contemplated that other systems, such as a programmed computer, may be utilized to manipulate temperature measurement data in accordance with the disclosed algorithm without departing from the scope of the present invention.

Referring now to FIG. 7 of the drawings, one example of a suitable algorithm for varying the magnitudes of the pulse periods $T_1$ and $T_2$, as a function of elapsed time in the monitoring period, is diagrammed. It will be apparent that, in addition to the possibility of implementing the algorithm by means of suitable hardware, such as by the subsystem illustrated in FIG. 3, all or part of the algorithm may be performed by conventional programming on a digital computer.

The $T_1$ and $T_2$ determining sequence begins with a conventional start step 230, followed by a step 231 wherein both the pulse interval timer and the elapsed timer are reset to zero. The next step 232 calls for waiting for a count pulse to increment the display register.

When a count pulse occurs, the question is asked at 233 whether or not the elapsed timer and pulse interval timer or running. If the elapsed timer and pulse interval timer are not running, as would be in the case when the measurement cycle has just begun and the first display register count pulse is being received, then the elapsed timer and pulse interval timer are started by step 235.

Once the elapsed timer and pulse interval timer are running, the question is asked every cycle at 236 to determine whether or not the elapsed timer registers a time greater than 13 seconds. If the answer is no, then $T_1$ and $T_2$ are set to appropriate values, e.g., 1.0 seconds, and 1.3 seconds, respectively, by step 237.

An affirmative answer to question 236 results in a second question 238 regarding whether or not the elapsed timer registers greater than 23 seconds. If the answer is no, then $T_1$ and $T_2$ are set to 1.5 seconds and 2.0 seconds, respectively, by step 239. If the answer is yes, then $T_1$ and $T_2$ are set to 2.0 seconds and 2.6 seconds, respectively, by step 241.

Once $T_1$ and $T_2$ have been set by one of the steps 237, 239 or 241, these values may be used for the appropriate $T_1$ and $T_2$ indications in the overall system algorithm shown in FIG. 6.

By way of further example, in another data flow handling configuration, each of the steps 237, 239, 241 results in a question at 242 asking "is the interval timer registering a count greater than the pulse period $T_1$?". This algorithm configuration assumes that, except for the starting count pulse to the display register (indicating that the thermistor temperature has just exceeded 93°F.), each counting pulse marks the end of a pulse timing interval, which is first compared with the pulse period $T_1$ before setting the pulse interval timer to zero. In this regard, if the answer to the question at 242 is negative, then the pulse interval timer is reset to zero by step 243 and a return is made to step 232 waiting for another count pulse to the display register.

If the pulse interval timer registers a count greater than the pulse period $T_1$, then the timer is reset to zero by step 244 and a question is asked at 246, with the pulse interval timer running, whether an additional pulse interval has now elapsed which is greater than the second required pulse period $T_2$. If the answer is yes, then a count pulse is immediately added to the display register and the measurement cycle is terminated, all by step 247. If the answer to the question at 246 is negative, then a wait step 248 is performed with the question 249 constantly being asked regarding whether or not a count pulse has been received. If the answer is no, then a recomparison of the pulse interval timer with the pulse period $T_2$ continues to be made at 246.

If a count pulse is received before the pulse interval timer registers a count greater than $T_2$, then a return is made from the question at 249 to the comparison at 242 which determines whether or not the pulse period exceeded the pulse period $T_1$. If the last pulse period was greater than $T_1$, step 244 is performed and the quest for the pulse period $T_2$ is again initiated. If the pulse period was less than $T_1$, as would be the case if tissue contact was lost and subsequently reacquired, then step 243 is performed, and the next pulse period will be re-examined first for compliance with the pulse period $T_1$ before any search will be initiated for a successive pulse interval satisfying the $T_2$ pulse period requirement.

Figure 8:
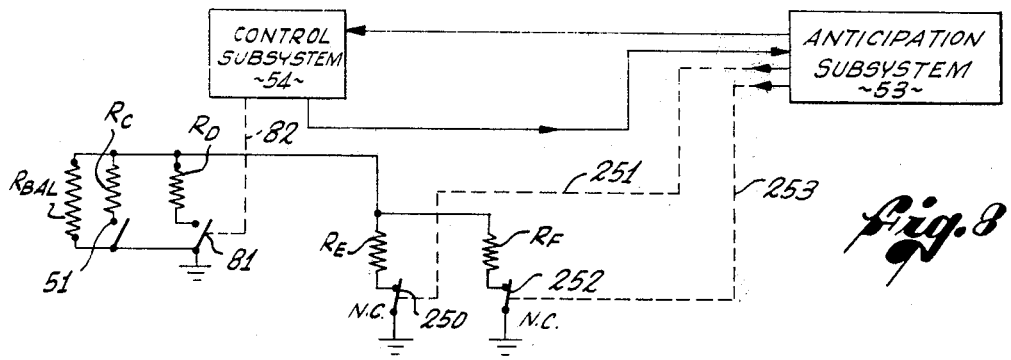

Referring now to FIG. 8 of the drawings, an alternative method of varying the anticipation correction introduced as a function of elapsed time is indicated. In the subsystem shown in FIG. 8, the $T_1$ and $T_2$ pulse periods have constant magnitudes throughout the measurement cycle, and the magnitude of the anticipation correction introduced is varied by means of additional imbalance introduced into the bridge network 47.

Portions of the bridge network 47 shown in FIG. 2 are reproduced in FIG. 8, including $R_{BAL}$, the duty cycle resistance $R_C$ and its associated switch 51, and the extended mode resistance $R_D$ and its associated offset switch 81 controlled by line 82 from the control subsystem 54. As previously indicated, the switch 81 is normally open, and, if it is determined that the system should go into the extended mode of operation, the switch 81 is then closed to insert the shunt resistance $R_D$ and thereby lower the net resistance in the balancing arm of the bridge so that the display register 40 and thermistor 48 are in phase regarding temperature, with no anticipatory lead in the output indication.

In order to provide varying anticipatory corrections with elapsed time, so that the temperature differential by which the display register leads the actual temperature of the thermistor increases with increasing time into the measurement cycle, a pair of additional shunt resistors $R_E$ and $R_F$ are initially included in the bridge balance arm, and their resistance is included in determining what the magnitude of $R_{BAL}$ should be to introduce, for example, the desired 1°F temperature differential for the anticipation mode of operation.

Referring now to FIG. 3, as well as to FIG. 8, the output of the elapsed timer decoder 93 over line 251 opens a normally closed switch 250 when the elapsed timer 90 registers a time greater than 13 seconds. This removes the shunt resistance $R_E$ from the balancing arm of the bridge, thus increasing the net resistance in the balancing arm and causing the display register to lead the thermistor temperature by an even greater temperature differential, such as 1.5°F.

Similarly, when the elapsed timer 90 in FIG. 3 registers a count greater than 23 seconds, the decoder 93 provides an output over line 253 which opens the normally closed switch 252 to remove the shunt resistance $R_F$, in addition to the resistance $R_E$ already removed, from the bridge balancing arm. Hence, the bridge balancing arm resistance is further increased, with the consequent result that the display register leads the thermistor temperature by a still greater temperature differential, such as 2.0°F.

Figure 9:
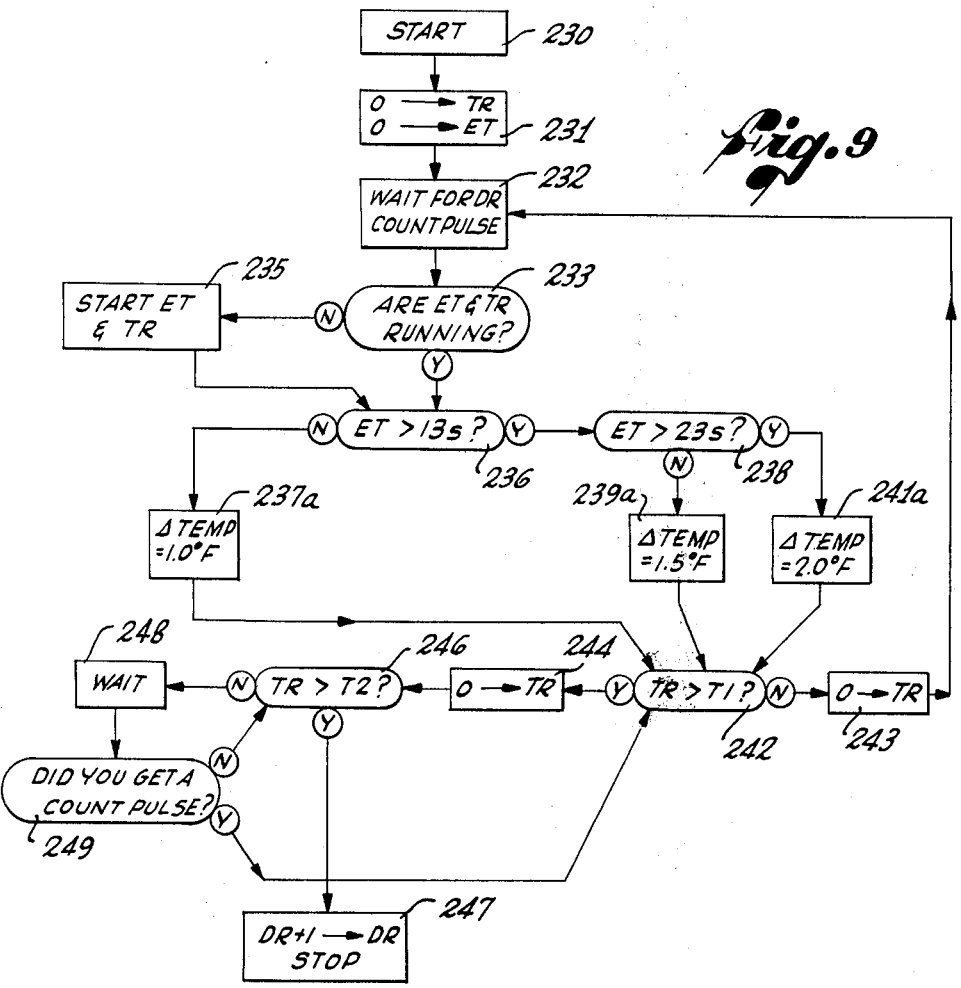
FIG. 9 is a flow chart illustrating an algorithm for handling temperature measurement data in accordance with the embodiment of the thermometer illustrated in FIG. 8.

Referring now to FIG. 9, an algorithm is diagrammed, similar to the algorithm shown in FIG. 7, but for the case where different anticipatory corrections are introduced by means of temperature differential changes, rather than changes in the magnitudes of the safeguard sequency pulse periods $T_1$ and $T_2$. In this regard, like reference numberals in FIG. 9 denote like or corresponding steps and questions in the algorithm previously discussed in connection with FIG. 7.

The difference between the algorithms of FIG. 7 and FIG. 9 resides in steps 237a, 239a, and 241a wherein different temperature differentials of 1.0°F, 1.5°F and 2.0°F, respectively, are introduced in FIG. 9, as opposed to the changes in the values of $T_1$ and $T_2$ introduced by steps 237, 239 and 241 in FIG. 7.

Referring now to FIG. 10, there is shown an adaptor subsystem for modifying digital thermometers to incorporate the pulse sequence safeguard and variable correction with elapsed monitoring period features of the present invention. The logic shown in FIG. 10 is, however, based on a non-synchronous system.

The adapter subsystem of the FIG. 10 uses a plurality of JK flip flops 261, 262, 263, 264, a pair of controlled oscillators 265, 266, AND gates 267, 268 OR gate 269, and an inverter 270.

The controlled oscillators 265, 266 are conventional controlled oscillators, well known in the art, which, when energized, generate a first pulse after a predetermined period of time, followed by successive pulses at regular intervals, the pulse periods after the initial starting period being of shorter duration. By way of example, one such controlled oscillator is a type NE55V controlled oscillator manufactured by Signetics, a subsidiary of Corning Glass Works, Sunnyvale, California.

The controlled oscillator 265, together with the flip-flops 261, 262, define an elapsed time monitoring system providing outputs over lines 272 and 273 to the input control circuitry of the controlled oscillator 266. The outputs over the lines 272 and 273 represent different elapsed monitoring periods to selectively alter the pulse frequency output of the controlled oscillator 266.

The balance of the subsystem in FIG. 10, comprising the controlled oscillator 266, flip flops 263, 264, and gates 267, 268 and 269 define the pulse interval timing subsystem for evaluating counting pulses in accordance with the pulse period sequence safeguard technique.

The adapter subsystem of FIG. 10 requires three types of signals from a digital thermometer intended to embody the variable correction and safeguard sequence features of the adapter subsystem. One of these signals is an RST signal which is the brief duration signal provided by a thermometer when it is initially energized for a measurement cycle. Also required is an STT signal which is the "start timing" signal. The STT signal is a normally "false" d.c. level signal which becomes "true" when the thermometer switches into the anticipation mode and starts timing. It might be provided, for example, by setting a flip-flop with the display counter pulse. It essentially states that the starting reference point for elapsed time (thermistor at 93°F.) has been reached. The ADP signal required is the "add pulse" signal and is provided by each counter pulse to the display register.

The RST signal is directed to the reset input of each of the flip flops 261, 262 and 264 provided over lines 275, 276, 277, respectively, to set these flip-flops initially in their "false" states so that their Q outputs are "true" and their Q outputs are initially "false."

In addition, a constant "true" input over line 281 is provided to the J input of the flip-flop 262, with a constant "false" input over line 278 being provided to the K input of that flip-flop.

Similarly, a "true" input is constantly directed over the line 279 to J input of the flip-flop 263, while a constantly "false" input is directed over line 280 to the K input of the latter flip-flop.

The STT timing signal is initially "false" and then becomes "true" at the prescribed reference point, e.g., when the thermistor exceeds 93°F. and counting pulses are to begin counting up the output display register.

The "false" state of the STT signal, over line 282, disables the oscillator 265. The "false" state of the STT signal, over line 283, is inverted by the inverter 270 and passed over line 284 to OR gate 269. The output of the OR gate 269 over line 285 is, hence, by virtue of the inverter 270, "true" and disables the oscillator 266.

When the STT signal goes "true," both of the controlled oscillators 265 and 266 are enabled. The timing waveform for the STT signal is shown in FIG. 11a.

Once enabled, the controlled oscillator 265 generates a first output pulse 13 seconds after it has been enabled, and generates additional pulses every 10 seconds thereafter over the oscillator output line 287, which is connected to the clocking input of the flip-flop 261. The timing waveform for the output of the oscillator 265 is shown in FIG. 11b.

As previously indicated, the flip-flops 261 and 262 are initially set "false" by the RST signal. In this regard, note that the "true" Q output of flip-flop 262 is directed over line 288 to both the J and K inputs of the flip-flop 261. Hence, when the first 13 second pulse from the controlled oscillator 265 clocks the input of the flip-flop 261, it sets the latter flip-flop "true" and, hence, its Q output over line 290 will be "true." This, in turn, makes the input over line 272 to the controlled oscillator 266 "true" and represents the pulse frequency control line for the period between 13 seconds and 23 seconds of elapsed time.

Prior to the control input line 272 going "true," the controlled oscillator 266 provides an output pulse frequency for the period where elapsed time is less than 13 seconds. With both pulse frequency control lines 272 and 273 "false," the pulse frequency output of the controlled oscillator 266 is a first pulse 1.0 seconds after the "disable" line 285 goes "false," followed by regular pulses every 0.3 seconds thereafter.

When the 13–23 second oscillator input line 272 goes "true," the pulse frequency is changed so that the initial pulse is a 1.5 second pulse and subsequent pulses occur approximately every 0.5 seconds. When the input line 273 goes "true," indicating an elapsed time of 23 seconds, the initial and subsequent pulse periods become 2.0 seconds and 0.6 seconds, respectively.

It will be apparent that, until the first 13 second pulse is generated by the oscillator 265, both of the lines 272, 273 to the oscillator 266 are "false," and the oscillator 266 generates a pulse output, once enabled, governed by the less than 13 seconds of elapsed time in the measurement cycle control period.

When the second pulse is generated by the controlled oscillator 265, 10 seconds after the occurrence of the first pulse and representing 23 seconds of elapsed time in the monitoring period, the flip-flop 261 is reset by the 23 second pulse so that its Q output over line 290 is "false," since both the J and K inputs of flip-flop 261 were "true" by virtue of the Q output of the flip-flop 262. This turns off the pulse frequency control input over line 272 to the oscillator 266. However, the pulse produced by the Q output of flip-flop 261 going from "true" to "false" generates a pulse over line 291 to the clocking input of the flip-flop 262 so that the latter flip-flop is set "true." This causes the line 273, representing more than 13 seconds of elapsed time, to go "true," and thereby set the output frequency of the oscillator 266 accordingly.

At the same time, the Q "false" output state of the flip-flop 262 is transferred to the J and K inputs of the flip-flop 261. Accordingly, all additional pulses produced by the oscillator 265, after the first two pulses, have no effect whatsoever upon either of the flip-flops 261 or 262, both of these flip-flops remaining in their "false" state throughout the remainder of the measurement cycle. In this way, the input line 273 to the controlled oscillator 266 sets the output frequency of the latter oscillator for the balance of the measurement cycle.

The timing waveforms for the flip-flops 261 and 262 are shown in FIGS. 11c and 11d, respectively.

As previously indicated, the flip-flops 261 and 262 control the output frequency of the controlled oscillator 266. The oscillator 266 starts running when the STT signal goes "true," and is restarted every time an ADP pulse is passed by the OR gate 269 over line 285 to momentarily disable the oscillator. In each case, the oscillator 266 initiates its output cycle by generating its first output pulse, assuming that the elapsed time is less than 13 seconds, 1.0 seconds after the oscillator in enabled and each pulse thereafter provided at 0.3 second intervals. However, if an ADP pulse is provided before the 1.0 second interval has elapsed, the output cycle is restarted anew, without the 1.0 second pulse of the previous output cycle ever being generated. In other words, as long as ADP count pulses keep coming more frequently than 1 per second, there is no output from the oscillator 266. However, the first time that an ADP pulse is produced followed by an interval of 1.0 seconds or more before the next ADP pulse, the oscillator 266 will produce a pulse output 1.0 seconds after the last time it was enabled. Hence, each time the oscillator 266 is disabled and re-enabled, its entire output cycle is reset to start from the beginning.

Assume that the pulse period of 1.0 seconds between ADP pulses finally occurs, either because of loss of contact with patient tissue, or because the end of the measurement cycle is being approached. In any event, the lack of an ADP pulse for 1.0 seconds or more indicates that the $T_i$ period of the safeguard pulse period sequence has been met. The controlled oscillator 266 produces a 1.0 second output pulse over line 293 which clocks the input of the flip-flop 263 so that the latter flip-flop is set "true." Hence, the Q output of flip-flop 263 goes "true" while the Q output goes "false," and both of these output states are transferred over lines 295, 296, respectively, to the J and K inputs, respectively, of the flip-flop 264 which remains "false."

Additional output pulses every 0.3 seconds from the controlled oscillator 266, as might occur if the thermometer probe has lost contact with the tissue, continue to clock the input of the flip-flop 263 with no effect since the latter flip-flop is already "true" and, with its J input "true" and K input false, will remain in the "true" state every time the flip-flop is clocked over line 294.

The "true" Q output of the flip-flop 263 also provides an enabling input over line 297 to the AND gate 267. However, the output of the gate 267 over line 298 remains "false" since the second input to the gate over line 299, which is the Q output of the flip-flop 264, is still "false."

When the next ADP pulse occurs, it not only restarts the oscillator 266, but resets the flip-flop 263 over line 301, and clocks the input of the flip-flop 264 over line 302. This transfers the previous state of the flip-flop 263 into the flip-flop 264, that is, it sets the flip-flop 264 to its "true" state, while simultaneously resetting the flip-flop 263 to its "false" state. As a result, the enabling input over 297 to the AND gate 267 goes "false," while the enabling input to the gate over line 299 goes "true." Therefore, flip-flop 263 being "false" and flip-flop 264 being "true" defines a state where the $T_1$ period requirement has been met and the next pulse is being checked for satisfaction of the $T_2$ pulse period requirement for the safeguard sequence.

After a pulse period of 1.0 seconds has elapsed, a pulse is produced by the oscillator 266 which clocks the input of the flip-flop 263 to set the latter flip-flop "true," thus enabling the gate 267, since nothing has happened to change the state of the flip-flop 264, and thereby providing an enabling input over line 298 to the AND gate 268.

If another ADP pulse has not occurred in the next 0.3 second time interval after the 1.0 second pulse was produced, then a second pulse is produced by the oscillator 266 and will pass over line 293, through the gate 268, and provide a "stop" pulse over line 300 which will end the measurement cycle in any manner desired, such as by adding one additional pulse to the output display register and turning on a read light, etc.

The aforedescribed timing sequence has been described for 1.0 and 1.3 second pulse period values for $T_1$ and $T_2$, when the elapsed time in the measurement cycle is less than 13 seconds. However, the same logic applies for the elapsed time interval between 13 and 23 seconds, as well as the period over 23 seconds, the only difference being in the magnitudes of the pulse periods involved.

If the case occurs where the $T_1$ pulse period requirement has been met, and the next pulse period is greater than $T_1$, but less than $T_2$, the situation arises where another ADP pulse is generated after the controlled oscillator 266 has generated its 1.0 second pulse, but before the latter oscillator has generated any 1.3 second pulse. Under these circumstances, the ADP signal over the reset input 301 to the flip-flop 263 resets the flip-flop 263 to its "false" state. At the same time, since the Q output of flip-flop 263 was "true," with the Q output being "false," the ADP pulse over line 302 leaves the flip-flop 264 in its "true" state. The controlled oscillator 266 is, of course, also reset by the ADP pulse over line 285.

Hence the result of a pair of pulses in succession, satisfying the $T_1$ pulse period requirement but not the $T_2$ requirement, results in resetting of the pulse evaluation subsystem to the conditions where flip-flop 263 is "false" and flip-flop 264 is "true" which, as previously indicated, defines a state where the $T_1$ period requirement has already been met and the next pulse is again being checked for satisfaction of the $T_2$ pulse period requirement. As a result, the first pulse from the controlled oscillator 266, 1.0 seconds after the last ADP pulse, will set the flip-flop 263 to its "true" state and, if no ADP pulse occurs within the next 0.3 second time interval after the 1.0 second pulse, the oscillator 266 will produce a second pulse which will pass through the gate 268 to terminate the measurement cycle in the appropriate manner.

Assuming the case where the $T_1$ pulse period requirement has been met, but the next pulse period is less than $T_1$, there will be no output from the oscillator 266, but the ADP pulse will reset the flip-flop 264 over line 302 to the clocking input of that flip-flop, since the flip-flop 263 was previously "false" and provides a Q "true" output to the K input of the flip-flop 264. The ADP signal over the reset input 301 to the flip-flop 263 has no effect since the latter flip-flop was already in its "false" state. Hence, the result of receiving an ADP pulse defining a pulse period shorter than the period $T_1$, after previously having satisfied the $T_1$ period condition, is to reset the pulse evaluation subsystem, so that both flip-flops 263, 264 are "false," and the next pulse period will again be tested for $T_1$ before any search for a subsequent successive $T_2$ pulse period will be initiated.

It will be apparent that the adapter subsystem shown in FIG. 10 can be modified to provide corrections of varying magnitude, regarding the anticipatory temperature differential introduced, rather than varying the magnitudes of the $T_1$ and $T_2$ pulse periods searched for. In this regard, the lines 272 and 273 to the controlled oscillator 266 would be disconnected and would instead selectively enable appropriate switches for adding or removing resistance from a bridge network or the like, so that the magnitude of the anticipation correction would be altered, while the oscillator 266 would provide a pulse frequency output suitable for a single set of $T_1$ and $T_2$ pulse period requirements, as opposed to the three sets of $T_1$ and $T_2$ values presently embodied by the subsystem shown in FIG. 10.

Figure 12:
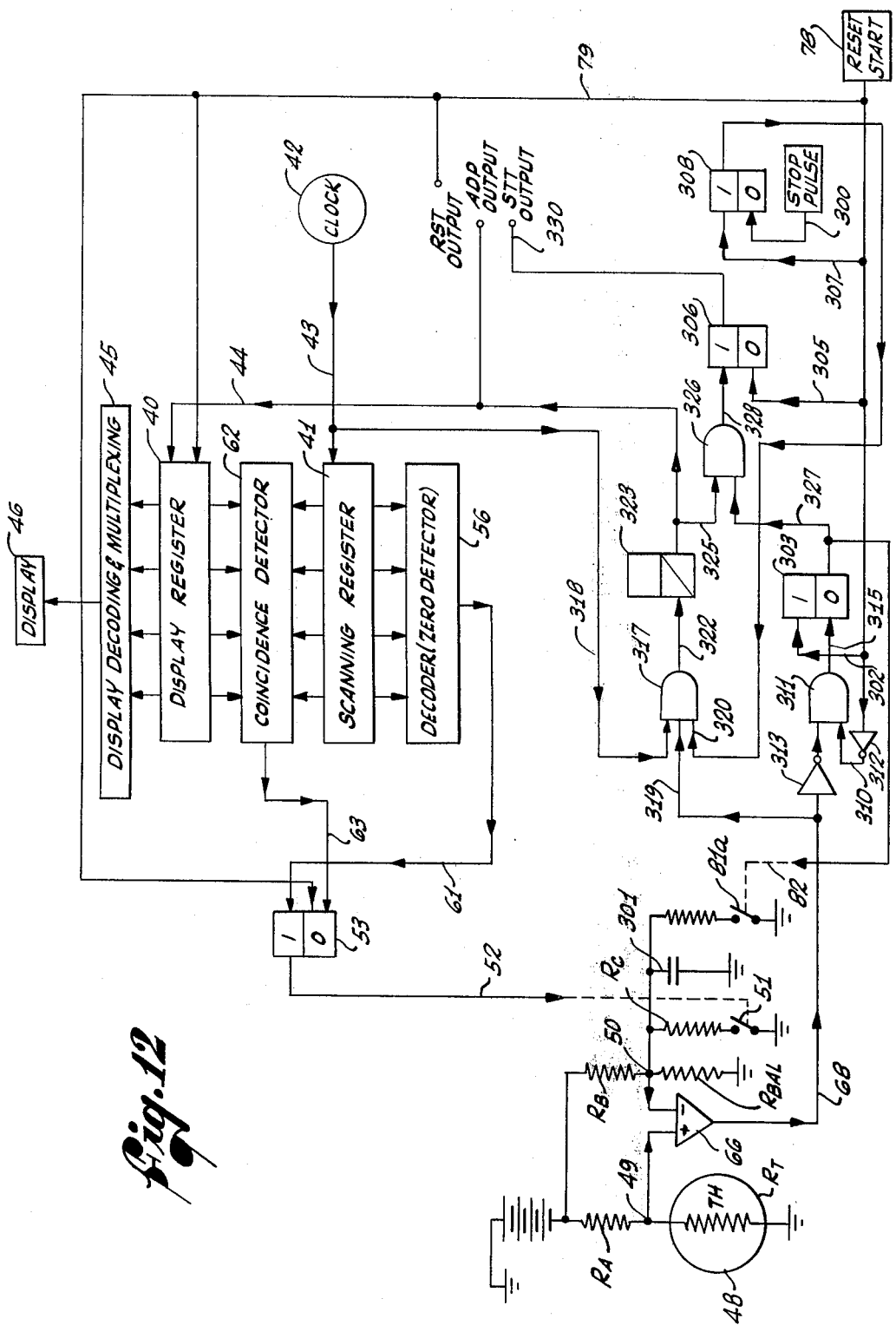
FIG. 12 is a combined block diagram and electrical schematic from another embodiment of an electronic thermometer in accordance with the present invention and particularly suited for use with the adapter subsystem of FIG. 10.

Referring now to FIG. 12 of the drawings, there is shown a generalized system for another embodiment of an electronic thermometer incorporating various features of the present invention. Like reference numerals in the system of FIG. 12 denote like or corresponding parts in the system of FIG. 2 previously discussed. The primary differences in the system of FIG. 12 reside in a modified form of the analog-to-digital converter and the use of a system particularly suited for use with the adapter subsystem taught in FIG. 10.

The thermometer system shown in FIG. 12 is also capable of being operated in either an extended mode, wherein the indicated temperature is the same as the temperature of the thermistor, or in a rapid anticipation mode, wherein the measured temperature indicated is an extrapolated higher temperature rather than the actual thermistor temperature.

The system of FIG. 12 includes a display register 40 and scanning register 41. The scanning register 41 is continuously counted up on cyclical basis by the clock 42 over line 43. The display register 40 is counted up by appropriate incrementing pulses received over line 44. The output of the display register 40 is directed to a display decoding and multiplexing subsystem 44 which, in turn, feeds an output digital display unit 46.

The display register 40 and scanning register 41 cooperate with each other to modulate the state of balance of a bridge network, including a thermistor 48, to selectively increment the display register 40 so that it counts up as the thermistor temperature increases. The bridge includes resistance $R_A$, $R_B$, and $R_{BAL}$ electrically connected in a d.c. Wheatstone bridge configuration, with the electrical output of the bridge available at terminals 49, 50, all as in the embodiment of FIG. 2.

The switch flip-flop 53, switch 51 and, hence, the duty cycle of the shunt resistance $R_C$ in the balancing arm of the bridge is controlled by the constantly compared states of the display register 40 and scanning register 41 to modulate the state of balance of the bridge by varying the time that the resistance $R_C$ is connected into the balance arm of the bridge. In this regard, as in the embodiment of FIG. 2, the ratio of closed to open time for the switch 51, and, hence, the ratio of time in to time out for the resistance $R_C$ is representative of the count in a display register 40.

The state of the scanning register 41 is decoded by the zero detector 56 which provides an output over the line 61, each time the scanning register goes through zero, to switch the flip-flop 53 to its 1 state and thereby connect the resistance $R_C$ into the bridge balancing arm. The coincidence detector 62 constantly compares the states of the display register 40 and the scanning register 41 and, each time the two registers have counts of equal magnitude, the detector 62 generates a coincidence output over line 63 to set the switch flip-flop 53 into its 0 state and thereby disconnect the resistance $R_C$ from the balancing arm of the bridge.

Hence, the switch flip-flop 53 gets reset to its 1 state every time the scanning register 41 goes through zero, thus gating the switch 51 on. The flip-flop 53 gets set to its 0 state ever time the scanning register has the same count as the display register, thus gating the switch 51 off. The switch 51 is thereby periodically turned on and off, once for every full count cycle of the scanning register 41. In this way, electrical output of the bridge at the terminals 49, 50 varies in accordance with the count in the display register 40. One primary difference between the system of FIG. 12 and the system of FIG. 2 is that the system of FIG. 2 used a dual ramp integrator 65 to evaluate bridge output during every cycle of the scanning register 41 by determining at the end of every cycle whether or not the bridge output justified another count being directed to the display register 40. This evaluation did not depend upon the bridge being in balance, but rather evaluated the type of imbalance existing on a cycle by cycle basis to determine rapidly when counts should be added to the display register. Hence, the system of FIG. 2 used a non-nulling bridge. In contrast, the system of FIG. 12 uses a nulling bridge which will indicate the need for additional counts in the display register 40 on an averaging basis over several cycles of the scanning register 41 when the bridge output goes off null.

Hence, the system of FIG. 12 uses a conventional operational amplifier 66 to detect bridge output, rather than a dual ramp integrator. In addition, a capacitor 301 shunts the balancing arm of the bridge to average the pulses in the bridge and minimize ripple in the output detector. The average current flowing through the resistor $R_C$ is determined by the ratio of the on to off time of the latter resistance which, of course, is a measure of the count in the display register 40. While the bridge evaluation system of FIG. 12 is simpler in electrical circuitry than the system of FIG. 2, it will generally be slower in speed of response. The speed of response of the system in FIG. 12 can be enhanced somewhat, however, by using a smaller capacitor 301 and increasing the frequency of the clock 42.

The reset start subsystem 78 not only directs a reset signal over line 79 to reset the display register 40 to its 94°F. reference state, and the switch flip-flop 53 to its 0 state, but also directs a reset signal over line 302 to set a flip-flop 303 to its 1 state. Reset signals are also directed over line 305 to set a flip-flop 306 to its 0 state, over line 307 to set a flip-flop 308 to its 1 state, and over line 310, through an inverter 312, as a pulse input to an AND gate 311.

Another input to the AND gate 311 is the output level of the bridge detector amplifier 66, over line 68, after first being inverted by an inverter 313. Hence, during the reset period, if the thermistor 48 is initially lower than the starting reference temperature of 94°F., the bridge output will be negative which, as a result of the inverter 313, will provide an enabling input to the gate 311. Thus, the gate 311 remains disabled during the "reset" period, but is momentarily enabled by a transient pulse, generated by termination of the reset signal, the latter pulse being passed by the gate 311 as a "true" output over line 315 to set the flip-flop 303 to its 0 state. The latter state of the flip-flop 303 opens a normally closed switch 81a, via line 82, to remove the extended mode resistance $R_D$ shunting the bridge balancing arm, thus placing the temperature measurement system in the anticipation mode and causing the count registered in the display register 40 to lead the actual temperature of the thermistor 48 by the predetermined temperature differential of 1°F. in order to compensate for the higher net resistance of the bridge balancing arm.

An AND gate 317 receives as one input over line 319 the electrical output of the bridge detector amplifier 66. In this connection, the gate 317 is enabled by a "true" output from the amplifier 66, the latter occuring only when the thermistor temperature represented by the resistance $R_T$ exceeds the equivalent temperature represented by the net resistance in the balancing arm of the bridge. The AND gate 317 also receives an enabling input over line 320 from the flip-flop 308 which is in the 1 state. In addition, pulses from the clock 42 are directed over line 318 and are passed through the AND gate 317, over line 322, to the lower half of a monostable flip-flop or one-shot 323, so that each of the pulses passed by the gate 317 over line 322 sets the one-shot to its unstable state. The pulse output from the lower half of the one-shot is directed over line 44 as incrementing pulse input to the display register 40.

The pulse output from the one-shot 323 is also directed over line 325 as a pulse input to an AND gate 326, a second enabling input to the AND gate 326 being received from the 0 state of the flip-flop 303 over line 327. Under these conditions, the AND gate 326 provides an output over line 328 to set the flip-flop 306 to its 1 state.

It will be apparent that the temperature measurement system of FIG. 12 can be readily utilized with the adapter subsystem of FIG. 10. In this connection, the RST signal is readily derived from the output of the reset start subsystem over line 79. In addition, the STT signal, indicating the start of timing in the anticipation mode, can readily be obtained over line 300 from the 1 state of the flip-flop 306. In addition, the ADP signal, indicating an additional pulse to the display register, is readily obtained from a display register pulse line 44 at the output of the one-shot 323. These outputs are indicated in FIG. 12.

When the "stop" pulse provided by gate 268 (FIG. 10) over line 300 is used to set the flip-flop 309 of FIG. 12 to its 0 state, the AND gate 317 is disabled, no further counting pulses are passed to the display register 40, and the measurement cycle is thus properly terminated.

Referring now, again to FIG. 2 of the drawings, certain additional advantages of the analog-to-digital conversion system of the present invention will now become apparent. As previously indicated, the bridge network 47 includes a dual ramp integrator 65 at the output terminals 49, 50 of a conventional d.c. Wheatstone bridge. The output of the dual ramp integrator over line 68, when the bridge is in balance, has a negative ramp time to positive ramp time ratio which is a measure of the display register count when it corresponds with the temperature of the thermistor 48 (ignoring any deliberate resistance changes in the balancing arm of the bridge to introduce the anticipation correction). Hence, since the display register 40 is measuring the resistance of the thermistor 48, the bridge network 47 can be considered a digital resistance meter. Moreover, it can be shown that the resulting digital resistance meter is independent of the voltage of the reference supply (the bridge battery). The reason for the latter is that the ratio of negative ramp to positive ramp times in each output cycle can be shown to be a function of the ratio of the unknown voltage (the voltage across the thermistor 48) to the reference voltage. However, since the unknown voltage in the system of FIG. 2 can be expressed as a fractional part of the reference voltage, by virtue of the voltage divider configuration, the reference voltage term drops out, so that the ratio of negative ramp time to positive ramp time is independent of the reference voltage.

In addition, typical thermistor resistance vs. temperature characteristics are non-linear. While attempts have been made in the prior art to linearize such response characteristics by adding series and parallel resistance combinations to the thermistor, such linearizing approaches generally also result in reduced temperature sensitivity. In contrast, the analog-to-digital converter of FIG. 2 provides non-linear analog-to-digital conversion which compensates for the non-linearity of the thermistor response so that the count in the display register 40 is a linear function of temperature, while the resistance $R_T$ of the thermistor 48 is a non-linear function of temperature. This compensation for the non-linearity of the thermistor 48 results in no substantial loss of temperature sensitivity. The non-linearity compensation is accomplished by a loaded voltage divider in the bridge network. In this regard, the voltage divider formed by the resistances $R_B$ and $R_{BAL}$ is selectively loaded by the resistance $R_C$ and is inherently non-linear. The degree of non-linearity provided by the system may be selectively varied by empirically tailoring the values of the various resistances in the loaded voltage divider to alter their resistance ratios until the desired compensation is achieved.

The aforedescribed electronic thermometer system of the present invention satisfies a need for improved thermometers capable of making more accurate, more reliable and easy to read temperature measurements very rapidly, and in a manner essentially independent of the measurement techniques of operating personnel.

It will be apparent from the foregoing that, while particular forms of the invention have been illustrated and described, various modifications can be made without departing from the spirit and scope of the invention. Accordingly, it is not intended that the invention be limited, except as by the appended claims.

I claim:

1. Measurement apparatus, comprising:
   switch means having ON and OFF states;
   first counter means;
   means for cyclically counting said first counter means;
   second counter means;
   means for comparing the output signals of said first and said second counter means and conditioning said switch means to one of its ON or OFF states in response to preselected relative states of said first counter means and said second counter means;
   means responsive to a preselected state of said first counter means to condition said switch to the other of its ON or OFF states; and
   a bridge network, wherein the state of balance of said bridge network is controlled by said switch means.

2. In a measurement system wherein electrical pulses represent a changing condition being monitored during a measurement cycle, the combination comprising:
   first means for monitoring said pulses;
   second means responsive to a prescribed sequence of pulse conditions to terminate said measurement cycle;
   third means for monitoring the elapsed time in the measurement cycle; and
   fourth means for varying said prescribed sequence of pulse conditions as a function of elapsed time.

3. A combination as set forth in claim 2, wherein said second means is responsive to a successive sequence of at least two pulse periods of prescribed magnitudes.

* * * * *

UNITED STATES PATENT AND TRADEMARK OFFICE
CERTIFICATE OF CORRECTION

PATENT NO. : 3,942,123  
DATED : March 2, 1976  
INVENTOR(S) : Heinz W. Georgi

Page 1 of 3

It is certified that error appears in the above-identified patent and that said Letters Patent are hereby corrected as shown below:

In the Abstract line 25, delete "termistor" and insert therefor --thermistor--.

Column 4, line 16, delete "usge" and insert therefor --usage--.

Column 5, line 52, delete "sybsystem" and insert therefor --subsystem--.

Column 6, line 1, after "respectively" delete "," and insert therefor --.--

Column 7, line 10, delete "tempeature" and insert therefor --temperature--; line 25 delete "cyclebasis" and insert therefor --cycle by cycle basis--.

Column 9, line 33, delete "fron" and insert therefor --from--.

Column 10, line 60, delete "perios" and insert therefor --period--.

Column 15, line 31, delete "d.d." and insert therefor --d.c.--.

Column 17, line 40, delete "regsiter" and insert therefor --register--.

Column 19, line 33, after "display", insert --register--; line 41, delete "wheater" and insert therefor --whether--.

Column 20, line 36, delete "A" and insert therefor --As--.

UNITED STATES PATENT AND TRADEMARK OFFICE
CERTIFICATE OF CORRECTION

PATENT NO. : 3,942,123

DATED : March 2, 1976

INVENTOR(S) : Heinz W. Georgi

It is certified that error appears in the above-identified patent and that said Letters Patent are hereby corrected as shown below:

Column 21, line 28, after "ramp", insert --,--.

Column 22, line 13, after "142," insert --143,--.

Column 23, line 3, "1" should be --"1"--; line 6, "1" should be --"1"--; line 14, "1" should be --"1"--; line 25, "0" should be --"0"--; line 29, "1" should be --"1"--; line 34, "4" should be --"4"--; line 36, after "register" insert, --went--; line 57, "1" should be --"1"--.

Column 24, line 11, "1" should be --"1"--; line 17, "3" should be --"3"--; line 52, delete "AND" (second occurrence) and insert therefor --add--; line 53 "1" should be --"1"--; line 58, "5" should be --"5"--; line 64, delete "thruogh" and insert therefor --through--.

Column 25, line 5, "0" should be --"0"--; line 13, after "flip-flop", insert --"53"-- and "0" should be --"0"--; line 19, "2" should be --"2"-- and "3" should be --"3"--; line 25, "1" should be --"1"--; line 27, "0" should be --"0"--; line 28, "1" should be --"1"--; line 32, "1" should be --"1"--; line 34, "0" should be --"0"--; line 40, "5" should be --"5"--; line 43, "1" should be --"1"--; line 44, "2" should be --"2"--; line 45, "2" should be --"2"-- and "3" should be --"3"--; line 49, "2" should be --"2"-- and "2" should be --"2"--; line 50, "3" should be --"3"--; line 52, "3" should be --"3"--; line 60, "0" should be --"0"-- and "1" should be --"1"--; line 63, "1" should be --"1"-- and "2" should be --"2"-- and "5" should be --"5"--; line 67, "3" should be --"3"--.

UNITED STATES PATENT AND TRADEMARK OFFICE
CERTIFICATE OF CORRECTION

PATENT NO. : 3,942,123       Page 3 of 3
DATED      : March 2, 1976
INVENTOR(S) : Heinz W. Georgi It is certified that error appears in the above-identified patent and that said Letters Patent are hereby corrected as shown below:

Column 26, line 3, "4" should be --"4"--; line 33 delete "or" and insert therefor --are--.

Column 28, line 17, delete "numberals" and insert therefor --numerals--.

Column 30, line 42, delete "in" and insert therefor --is--.

Column 32, line 23, "K" should be --"K"--.

Column 33, line 11, "resistance" should be --resistances--; line 29, "1" should be --"1"--; line 36, "0" should be --"0"--; line 38 "1" should be --"1"--; line 41 "0" should be --"0"--.

Column 34, line 14, "0" should be --"0"--; line 15 "1" should be --"1"--; line 16, "0" should be --"0"--; line 17, "1" should be --"1"--; line 32, "0" should be --"0"--; line 51, "1" should be --"1"--; line 62, "0" should be --"0"--; line 65, "1" should be --"1"--.

Column 35, line 4, "1" should be --"1"--; line 12, "0" should be --"0"--.

Signed and Sealed this

Seventh Day of September 1976

[SEAL]

Attest:

RUTH C. MASON
*Attesting Officer*

C. MARSHALL DANN
*Commissioner of Patents and Trademarks*